(12) United States Patent
Saito et al.

(10) Patent No.: US 12,094,742 B2
(45) Date of Patent: Sep. 17, 2024

(54) PROCESSING APPARATUS

(71) Applicant: DISCO CORPORATION, Tokyo (JP)

(72) Inventors: Yoshinobu Saito, Tokyo (JP);
Yoshinori Kakinuma, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 585 days.

(21) Appl. No.: 17/448,072

(22) Filed: Sep. 20, 2021

(65) Prior Publication Data

US 2022/0108903 A1   Apr. 7, 2022

(30) Foreign Application Priority Data

Oct. 1, 2020   (JP) ................. 2020-167053

(51) Int. Cl.
| | | |
|---|---|---|
| H01L 21/683 | (2006.01) | |
| B23K 26/364 | (2014.01) | |
| B23K 26/402 | (2014.01) | |
| B23K 103/00 | (2006.01) | |
| B65G 47/91 | (2006.01) | |
| H01L 21/673 | (2006.01) | |
| H01L 21/68 | (2006.01) | |

(52) U.S. Cl.
CPC ...... *H01L 21/67346* (2013.01); *B23K 26/364* (2015.10); *B23K 26/402* (2013.01);
(Continued)

(58) Field of Classification Search
CPC ......... H01L 21/67132; H01L 21/67092; H01L 21/6836; H01L 2221/68327; H01L 21/304; H01L 21/6838; H01L 21/78; H01L 21/67766; H01L 21/68707; H01L 21/67115; H01L 23/544; H01L 21/6715; H01L 21/67173; H01L 21/67706; H01L 2223/54493; H01L 21/02013; H01L 21/67219; H01L 21/681; H01L 21/6835; H01L 2221/6834; H01L 2221/68381; H01L 21/67103; H01L 21/67253; H01L 21/67346; H01L 21/6773; H01L 21/67742; H01L 21/67769; H01L 21/67778; H01L 21/68728; H01L 2221/68386; H01L 2924/00; H01L 2924/0002; H01L 21/3043; H01L 21/31058; H01L 21/67161; H01L 21/67207; H01L 21/67259; H01L 21/67745; H01L 21/67748; H01L 21/67775; H01L 21/68764;
(Continued)

(56) References Cited

U.S. PATENT DOCUMENTS

| | | | | |
|---|---|---|---|---|
| 6,998,571 | B2 * | 2/2006 | Sekiya ................ | B23K 26/40 257/E21.599 |
| 7,598,120 | B2 * | 10/2009 | Yamamoto ........ | H01L 21/67132 438/106 |

(Continued)

FOREIGN PATENT DOCUMENTS

JP           2010062375 A       3/2010

*Primary Examiner* — Chris Q Liu
(74) *Attorney, Agent, or Firm* — Greer Burns & Crain Ltd.

(57) ABSTRACT

A processing apparatus includes a wafer unloading unit, a wafer table, a frame unloading unit, a frame table, a tape affixing unit, a tape-affixed frame transporting unit, a tape compression-bonding unit, a frame unit unloading unit that unloads a frame unit in which a tape of a tape-affixed frame and the undersurface of a wafer are compression-bonded to each other from the wafer table, a reinforcing portion removing unit, a no-ring unit unloading unit, and a frame cassette table.

10 Claims, 16 Drawing Sheets

(52) U.S. Cl.
CPC .......... *B65G 47/911* (2013.01); *H01L 21/681* (2013.01); *H01L 21/6836* (2013.01); *H01L 21/6838* (2013.01); *B23K 2103/56* (2018.08); *B65G 2201/0297* (2013.01)

(58) Field of Classification Search
CPC . H01L 2221/68318; H01L 2221/68336; H01L 2223/54453; H01L 29/1608; H01L 21/02016; H01L 21/02019; H01L 21/02065; H01L 21/02076; H01L 21/02282; H01L 21/02307; H01L 21/02623; H01L 21/0271; H01L 21/0445; H01L 21/28512; H01L 21/32115; H01L 21/67005; H01L 21/67017; H01L 21/67046; H01L 21/67063; H01L 21/67098; H01L 21/67121; H01L 21/67155; H01L 21/67167; H01L 21/67184; H01L 21/67196; H01L 21/6723; H01L 21/67242; H01L 21/67276; H01L 21/67294; H01L 21/6732; H01L 21/67718; H01L 21/67721; H01L 21/67739; H01L 21/68; H01L 21/68721; H01L 21/68742; H01L 21/68771; H01L 21/68785; H01L 21/76862; H01L 21/77; H01L 22/20; H01L 2221/68363; H01L 2221/6839; H01L 2223/54413; H01L 2223/54426; H01L 2223/54433; H01L 29/66348; B23K 2101/40; B23K 2103/56; B23K 26/53; B23K 26/0006; B23K 26/38; B23K 2103/50; B23K 26/083; B23K 26/364; B23K 26/40; B23K 26/032; B23K 26/0622; B23K 26/16; B23K 26/402; B23K 37/0408; B23K 26/00; B23K 26/0093; B23K 26/0823; B23K 26/0838; B23K 26/0853; B23K 26/0869; B23K 26/0884; B23K 26/60; B23K 26/702; B23K 2101/34; B23K 26/03; B23K 26/042; B23K 26/046; B23K 26/048; B23K 26/0626; B23K 26/064; B23K 26/08; B23K 26/0876; B23K 26/10; B23K 26/142; B23K 26/18; B23K 37/0235; B23K 37/0443; B23K 37/00
USPC ............ 219/121.68, 121.72, 121.82, 121.67, 219/121.83, 121.84, 158
See application file for complete search history.

(56) References Cited

U.S. PATENT DOCUMENTS

| | | | | |
|---|---|---|---|---|
| 7,896,047 B2* | 3/2011 | Yamamoto | ........ | H01L 21/67132 156/941 |
| 8,486,806 B2* | 7/2013 | Hirosawa | .......... | H01L 21/67132 438/464 |
| 2003/0133762 A1* | 7/2003 | Yamamoto | ........ | H01L 21/67748 406/198 |
| 2005/0236114 A1* | 10/2005 | Yanagita | ........... | H01L 21/67745 156/391 |
| 2007/0181245 A1* | 8/2007 | Kaneshima | ............. | B29C 63/02 156/499 |
| 2007/0231929 A1* | 10/2007 | Kajiyama | ........... | H01L 21/68707 438/6 |
| 2007/0238264 A1* | 10/2007 | Sekiya | ............. | H01L 21/67092 438/464 |
| 2008/0044258 A1* | 2/2008 | Akechi | ............... | H01L 21/6835 414/222.01 |
| 2009/0011572 A1* | 1/2009 | Kaneko | .............. | B23K 26/0853 134/1.2 |
| 2009/0057841 A1* | 3/2009 | Sekiya | .................. | H01L 23/544 257/E23.179 |
| 2009/0139662 A1* | 6/2009 | Nakamura | ........ | H01L 21/67346 156/764 |
| 2010/0000654 A1* | 1/2010 | Kondo | ................ | H01L 21/6836 156/60 |
| 2010/0055877 A1* | 3/2010 | Kajiyama | ............... | H01L 21/78 438/464 |
| 2011/0226747 A1* | 9/2011 | Furuta | .................... | B23K 26/40 219/121.72 |
| 2011/0290769 A1* | 12/2011 | Furuta | .................... | B23K 26/40 219/121.72 |
| 2011/0297329 A1* | 12/2011 | Canale | .................. | B32B 43/006 156/756 |
| 2013/0089970 A1* | 4/2013 | Amada | .................... | B24B 7/228 257/E21.237 |
| 2014/0048519 A1* | 2/2014 | Gadd | .................... | B23K 26/16 219/121.84 |
| 2014/0069588 A1* | 3/2014 | Hirakawa | ............. | B32B 43/006 156/750 |
| 2014/0234033 A1* | 8/2014 | Iwashita | ............. | H01L 21/6838 406/88 |
| 2015/0251902 A1* | 9/2015 | Bernales | ............. | B81C 1/00531 438/50 |
| 2015/0306774 A1* | 10/2015 | Abe | ..................... | H01L 21/6838 294/64.3 |
| 2015/0332909 A1* | 11/2015 | Suzuki | .................... | B24B 7/228 438/691 |
| 2015/0332928 A1* | 11/2015 | Priewasser | ........... | H01L 21/6836 438/460 |
| 2017/0301571 A1* | 10/2017 | Tsuchiya | ............ | H01L 21/6836 |
| 2018/0358250 A1* | 12/2018 | Sekiya | ............. | H01L 21/67769 |
| 2019/0006185 A1* | 1/2019 | Suzuki | ................ | H01L 21/6836 |
| 2019/0006212 A1* | 1/2019 | Iizuka | ................ | H01L 21/67721 |
| 2019/0148164 A1* | 5/2019 | Hirata | .................. | B23K 26/048 294/213 |
| 2019/0181024 A1* | 6/2019 | Iizuka | ................ | H01L 21/67207 |
| 2019/0181026 A1* | 6/2019 | Yamakawa | ................ | G06T 7/74 |
| 2019/0206673 A1* | 7/2019 | Watanabe | ............. | B24B 41/005 |
| 2020/0043754 A1* | 2/2020 | Namioka | ............. | H01L 21/6838 |
| 2020/0075311 A1* | 3/2020 | Osaga | ................ | H01L 21/6836 |
| 2020/0130106 A1* | 4/2020 | Iizuka | ................ | B23K 26/0093 |
| 2020/0171707 A1* | 6/2020 | Masada | ................ | B28D 5/0082 |
| 2020/0333702 A1* | 10/2020 | Iwatani | ............. | H01L 21/67745 |

* cited by examiner

PROCESSING APPARATUS

BACKGROUND OF THE INVENTION

Field of the Invention

The present invention relates to a processing apparatus for removing a ring-shaped reinforcing portion in a projecting shape from a wafer having the reinforcing portion formed in a projecting shape on an undersurface part corresponding to a peripheral surplus region.

Description of the Related Art

A wafer in which a device region having a plurality of devices such as integrated circuits (ICs), or large-scale integration (LSI) divided by a plurality of intersecting planned dividing lines and a peripheral surplus region surrounding the device region are formed on the top surface of the wafer is formed into a desired thickness by grinding the undersurface of the wafer, and is thereafter divided into individual device chips by a dicing apparatus or a laser processing apparatus. Each of the divided device chips is used in an electric apparatus such as a mobile telephone, or a personal computer.

The present applicant has proposed a technology that makes a ring-shaped reinforcing portion remain on the undersurface part corresponding to the peripheral surplus region in order to facilitate transportation of the ground wafer, performs predetermined processing, thereafter affixes a dicing tape to the undersurface of the wafer and supports the wafer by an annular frame, and removes the ring-shaped reinforcing portion from the wafer (see Japanese Patent Laid-Open No. 2010-62375, for example).

SUMMARY OF THE INVENTION

However, it is difficult to perform work of integrating the wafer with the annular frame by affixing the dicing tape to the undersurface of the wafer having the ring-shaped reinforcing portion formed in a projecting shape on the undersurface part corresponding to the peripheral surplus region, and it is difficult to remove the ring-shaped reinforcing portion from the wafer by cutting the ring-shaped reinforcing portion. There is thus a problem of poor productivity.

It is accordingly an object of the present invention to provide a processing apparatus that facilitates the work of integrating a wafer with an annular frame by affixing a dicing tape to the undersurface of the wafer having a ring-shaped reinforcing portion formed in a projecting shape on an undersurface part corresponding to a peripheral surplus region, and facilitates removal of the ring-shaped reinforcing portion from the wafer by cutting the ring-shaped reinforcing portion.

In accordance with an aspect of the present invention, there is provided a processing apparatus for removing a ring-shaped reinforcing portion in a projecting shape from a wafer having the reinforcing portion formed in the projecting shape on an undersurface part corresponding to a peripheral surplus region. The processing apparatus includes a wafer cassette table mounted with a wafer cassette housing a plurality of wafers, a wafer unloading unit configured to unload the wafer from the wafer cassette mounted on the wafer cassette table, a wafer table configured to support a top surface side of the wafer unloaded by the wafer unloading unit, a frame housing unit configured to house a plurality of annular frames in which an opening portion for housing the wafer is formed, a frame unloading unit configured to unload an annular frame from the frame housing unit, a frame table configured to support the annular frame unloaded by the frame unloading unit, a tape affixing unit disposed above the frame table and configured to affix a tape to the annular frame, a tape-affixed frame transporting unit configured to transport the annular frame to which the tape is affixed to the wafer table, position the opening portion of the annular frame at the undersurface of the wafer supported by the wafer table, and mount the tape-affixed frame on the wafer table, a tape compression-bonding unit configured to compression-bond the tape of the tape-affixed frame to the undersurface of the wafer, a frame unit unloading unit configured to unload, from the wafer table, a frame unit in which the tape of the tape-affixed frame and the undersurface of the wafer are compression-bonded to each other by the tape compression-bonding unit, a reinforcing portion removing unit configured to cut and remove the ring-shaped reinforcing portion from the wafer of the frame unit unloaded by the frame unit unloading unit, a no-ring unit unloading unit configured to unload the no-ring unit from which the ring-shaped reinforcing portion is removed from the reinforcing portion removing unit, and a frame cassette table mounted with a frame cassette configured to house the no-ring unit unloaded by the no-ring unit unloading unit, the frame unit unloading unit including a frame unit holding unit including a wafer holding portion configured to hold the wafer while exposing a whole or a part of a periphery of the wafer and a frame holding portion configured to hold the annular frame, a transporting unit configured to transport the frame unit holding portion to a temporary placement table, an imaging unit configured to image the periphery of the wafer of the frame unit held by the frame unit holding unit, and an illuminating unit facing the imaging unit and disposed at a position at which the wafer is interposed between the illuminating unit and the imaging unit. The frame unit unloading unit actuates the transporting unit and images at least three positions of the periphery of the wafer by the imaging unit, obtains central coordinates of the wafer, and makes a center of the wafer coincide with a center of the temporary placement table.

Preferably, the wafer unloading unit includes a transporting arm and a hand disposed at a distal end of the transporting arm and configured to support the undersurface of the wafer housed in the wafer cassette and invert a top side and an underside of the wafer. Preferably, the hand is a Bernoulli pad configured to generate a negative pressure by jetting air and support the wafer in a noncontact manner.

Preferably, the wafer table includes an annular supporting portion configured to support the peripheral surplus region of the wafer and leave a part on an inside of the peripheral surplus region in a noncontact state and a frame supporting portion disposed on a periphery of the annular supporting portion and configured to support the annular frame.

Preferably, the tape affixing unit includes a roll tape supporting portion configured to support a roll tape wound with the tape before usage, a tape winding portion configured to wind the tape already used, a tape extracting portion configured to extract the tape from the roll tape, a compression bonding unit configured to compression-bond the extracted tape to the annular frame, and a cutting portion configured to cut the tape extending off an outer circumference of the annular frame along the annular frame.

Preferably, the tape compression-bonding unit includes an upper chamber disposed above the wafer table, a lower chamber configured to house the wafer table, a raising and lowering mechanism configured to produce a closed state in which the upper chamber is lowered and set in contact with the lower chamber and an opened state in which the upper chamber is separated from the lower chamber, a vacuum portion configured to evacuate the upper chamber and the lower chamber in the closed state, and an atmosphere opening portion configured to open the upper chamber and the lower chamber to an atmosphere, and in a state in which the tape of the tape-affixed frame is positioned at the undersurface of the wafer supported by the wafer table, the upper chamber and the lower chamber are evacuated while the closed state is maintained by actuating the raising and lowering mechanism, and a pressing roller disposed in the upper chamber compression-bonds the tape of the tape-affixed frame to the undersurface of the wafer.

Preferably, the reinforcing portion removing unit includes a laser beam irradiating unit configured to form a cutting groove by applying a laser beam to a base of the ring-shaped reinforcing portion formed on the periphery of the wafer, a first raising and lowering table configured to hold and raise the frame unit temporarily placed on the temporary placement table, and position the frame unit at the laser beam irradiating unit, and a separating portion configured to separate the ring-shaped reinforcing portion from the cutting groove, the first raising and lowering table includes a small-diameter wafer holding portion smaller than an outside diameter of the wafer and configured to expose the ring-shaped reinforcing portion, a frame supporting portion having a permanent magnet configured to magnetically hold the annular frame, and a space configured to diffuse leakage light of the laser beam between the wafer holding portion and the frame supporting portion, the separating portion includes an ultraviolet ray irradiating portion configured to reduce an adhesive force of the tape by irradiating a tape corresponding to the cutting groove with an ultraviolet ray, a second raising and lowering table configured to suck and hold an inside of the wafer while exposing the ring-shaped reinforcing portion to a periphery of the second raising and lowering table, and support the annular frame, a separator configured to separate the ring-shaped reinforcing portion by acting on a periphery of the ring-shaped reinforcing portion, and a discarding portion onto which the separated ring-shaped reinforcing portion is discarded, and the first raising and lowering table temporarily places the frame unit in which the cutting groove is formed on the temporary placement table, the temporary placement table is positioned at the separating portion by a temporary placement table transporting unit, and the second raising and lowering table supports the frame unit temporarily placed on the temporary placement table.

Preferably, the temporary placement table includes a heater, and the first raising and lowering table holds, from the temporary placement table, the frame unit in which the tape is heated by the heater and the tape closely adheres to the base of the ring-shaped reinforcing portion.

Preferably, the temporary placement table includes an annular supporting portion configured to support the peripheral surplus region of the wafer and leave a part on an inside of the peripheral surplus region in a noncontact state and a frame supporting portion disposed on a periphery of the annular supporting portion and configured to support the annular frame, and the frame supporting portion includes a strong permanent magnet having a stronger magnetic force than the permanent magnet of the first raising and lowering table and a detaching portion configured to detach the annular frame magnetically held by the strong permanent magnet.

Preferably, the no-ring unit unloading unit includes an inverting mechanism having a frame holding portion configured to face the no-ring unit supported by the second raising and lowering table and hold the annular frame, the inverting mechanism being configured to move toward the frame cassette table and invert the frame holding unit, a no-ring unit supporting portion configured to support the no-ring unit inverted by the inverting mechanism such that a top surface of the wafer is oriented upward, and a push-in portion configured to advance and house the no-ring unit supported by the no-ring unit supporting unit into the frame cassette mounted on the frame cassette table.

According to the present invention, at least three positions of the periphery of the wafer are imaged by the imaging unit, the central coordinates of the wafer are obtained, and the center of the wafer is made to coincide with the center of the temporary placement table. Thus, it is easy to perform the work of integrating the wafer with the annular frame by affixing the dicing tape to the undersurface of the wafer having the ring-shaped reinforcing portion formed in a projecting shape on the undersurface part corresponding to the peripheral surplus region, and it is easy to perform removal of the ring-shaped reinforcing portion from the wafer by cutting the ring-shaped reinforcing portion. Excellent productivity is thus achieved.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

A processing apparatus according to a preferred embodiment of the present invention will hereinafter be described with reference to the drawings.

Figure 1:
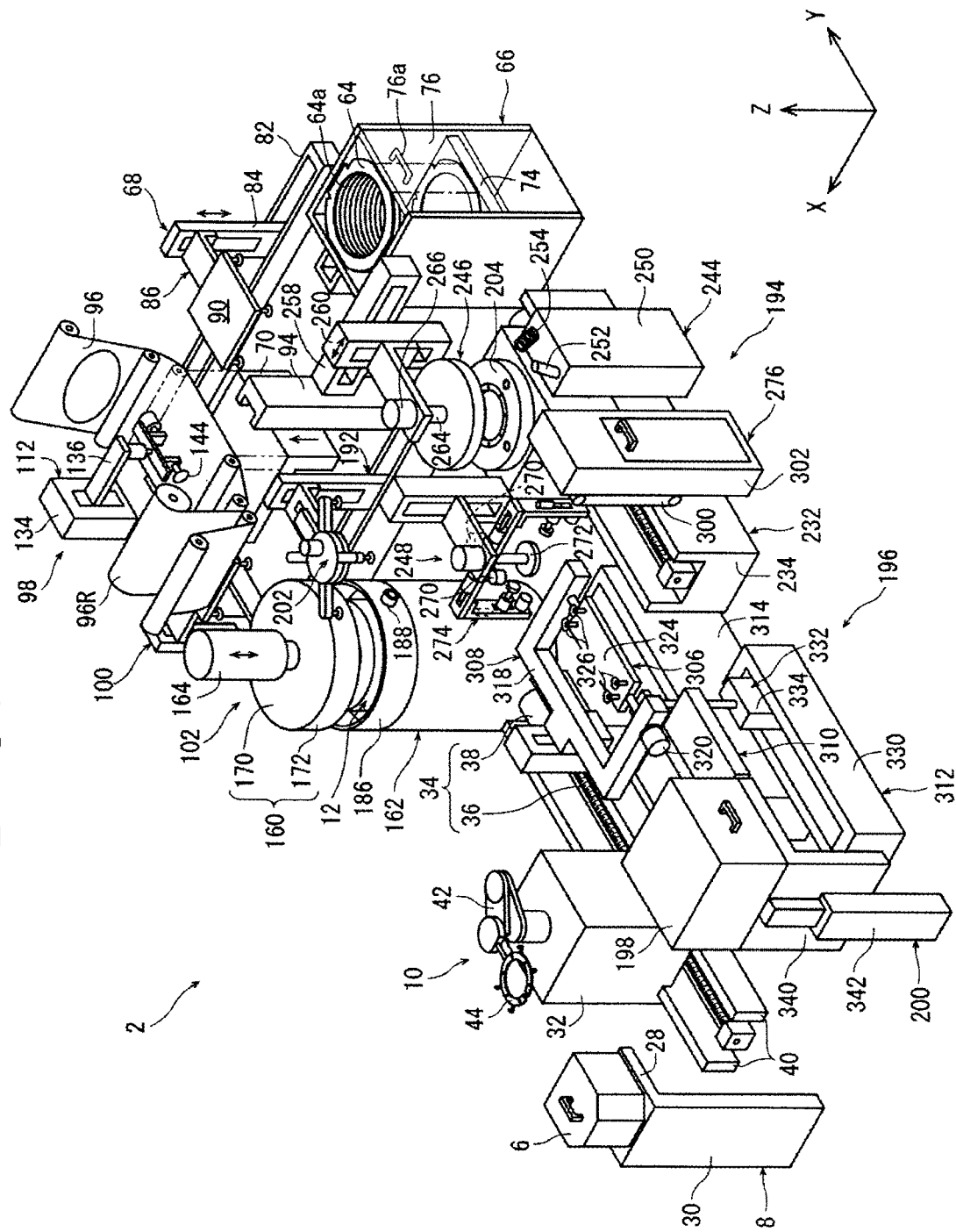
FIG. 1 is a perspective view of a processing apparatus according to an embodiment of the present invention.

Making description with reference to FIG. 1, the processing apparatus indicated in entirety by reference numeral 2 includes a wafer cassette table 8 mounted with a wafer cassette 6 housing a plurality of wafers, a wafer unloading unit 10 that unloads a wafer from the wafer cassette 6 mounted on the wafer cassette table 8, and a wafer table 12 that supports the top surface side of the wafer unloaded by the wafer unloading unit 10.

Figure 2:
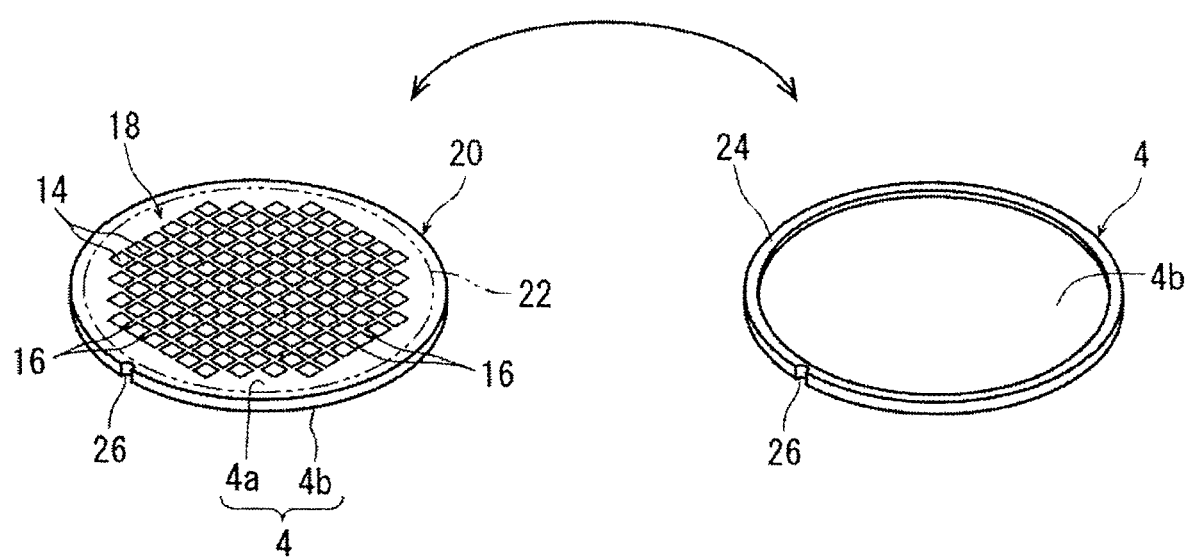
FIG. 2 is a perspective view of a wafer to be processed by the processing apparatus depicted in FIG. 1.

FIG. 2 depicts a wafer 4 to be processed by the processing apparatus 2. Formed on a top surface 4a of the wafer 4 are a device region 18 having thereon a plurality of devices 14 such as ICs, or LSIs demarcated by planned dividing lines 16 in a lattice shape and a peripheral surplus region 20 surrounding the device region 18. In FIG. 2, a boundary 22 between the device region 18 and the peripheral surplus region 20 is indicated by a chain double-dashed line for convenience. In actuality, however, the line indicating the boundary 22 is not present. On an undersurface 4b side of the wafer 4, a ring-shaped reinforcing portion 24 is formed in a projecting manner in the peripheral surplus region 20. The thickness of the peripheral surplus region 20 is larger than the thickness of the device region 18. In addition, a notch 26 indicating a crystal orientation is formed in the circumferential edge of the wafer 4.

Figure 3:
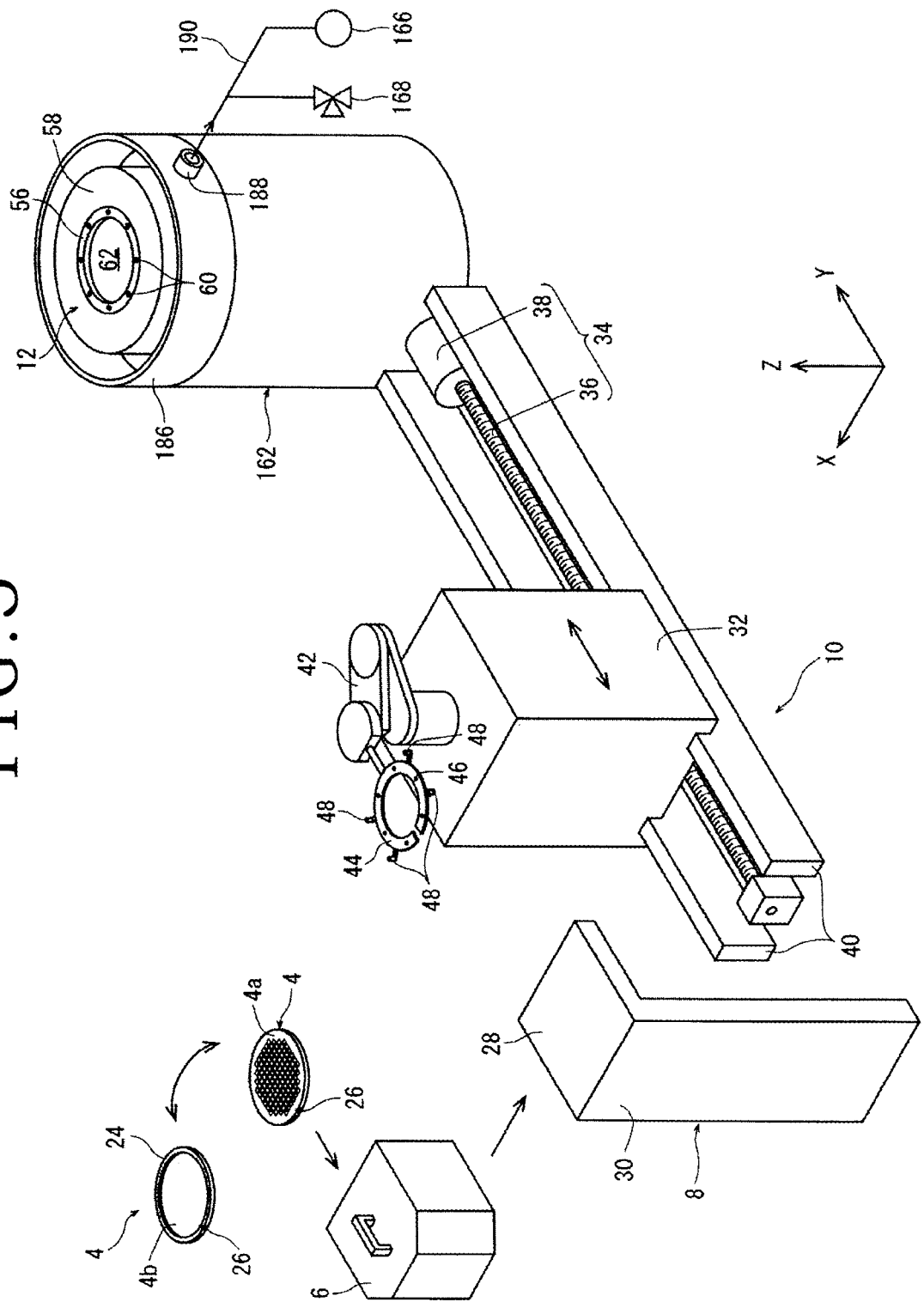
FIG. 3 is a perspective view of a wafer cassette table and the like depicted in FIG. 1.

As depicted in FIG. 3, the cassette 6 houses a plurality of wafers 4 at intervals in an upward-downward direction in a state in which the top surfaces 4a are oriented upward. The wafer cassette table 8 in the present embodiment has a top 28 mounted with the cassette 6 and a support plate 30 supporting the top 28. Incidentally, the top 28 may be freely raised and lowered, and raising and lowering means for positioning the top 28 at an optional height by raising or lowering the top 28 may be provided.

Continuing the description with reference to FIG. 3, the wafer unloading unit 10 includes a Y-axis movable member 32 movable in a Y-axis direction indicated by an arrow Y in FIG. 3 and a Y-axis feed mechanism 34 that moves the Y-axis movable member 32 in the Y-axis direction. The Y-axis feed mechanism 34 includes a ball screw 36 coupled to a lower end of the Y-axis movable member 32 and extending in the Y-axis direction and a motor 38 that rotates the ball screw 36. The Y-axis feed mechanism 34 converts rotary motion of the motor 38 into rectilinear motion by the ball screw 36, and transmits the rectilinear motion to the Y-axis movable member 32. The Y-axis feed mechanism 34 thereby moves the Y-axis movable member 32 in the Y-axis direction along a pair of guide rails 40 extending in the Y-axis direction. Incidentally, an X-axis direction indicated by an arrow X in FIG. 3 is a direction orthogonal to the Y-axis direction, and a Z-axis direction indicated by an arrow Z in FIG. 3 is an upward-downward direction orthogonal to the X-axis direction and the Y-axis direction. An XY plane defined by the X-axis direction and the Y-axis direction is substantially horizontal.

As depicted in FIG. 3, the wafer unloading unit 10 in the present embodiment includes a transporting arm 42 and a hand 44 that is disposed at a distal end of the transporting arm 42, and which supports the undersurface 4b of the wafer 4 housed in the wafer cassette 6 and inverts the top side and the underside of the wafer 4. The transporting arm 42 is provided on the upper surface of the Y-axis movable member 32, and is driven by an appropriate driving source (not depicted) such as an air driving source, or an electric driving source. This driving source drives the transporting arm 42 to position the hand 44 at an optional position in each of the X-axis direction, the Y-axis direction, and the Z-axis direction, and vertically inverts the hand 44.

Figure 4:
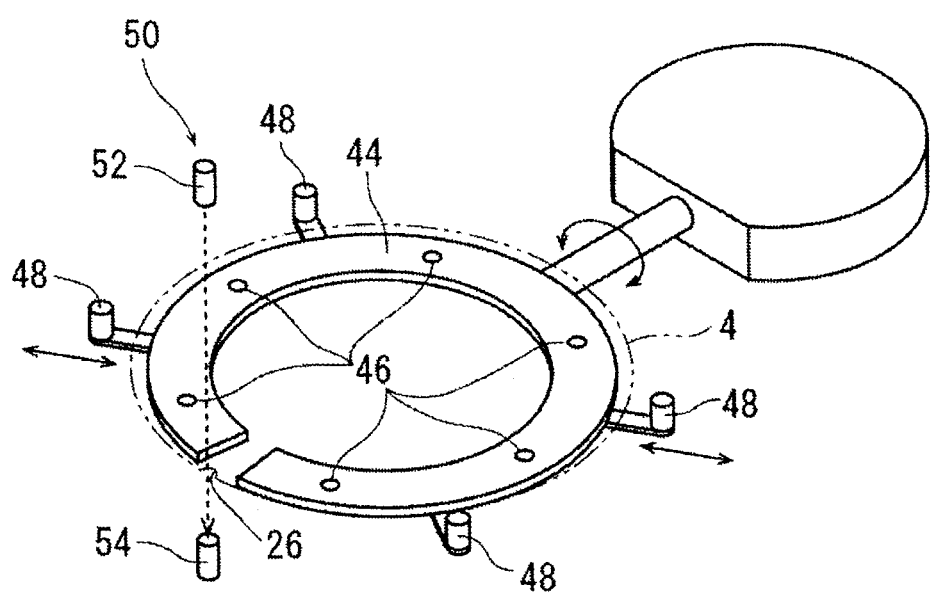
FIG. 4 is a perspective view of a hand depicted in FIG. 1.

Making description with reference to FIG. 4, the hand 44 is preferably a Bernoulli pad that generates a negative pressure by jetting air and thus supports the wafer 4 in a noncontact manner. The hand 44 in the present embodiment is in a C-shape as a whole. A plurality of air jetting ports 46 connected to a compressed air supply source (not depicted) are formed in one surface of the hand 44. A plurality of guide pins 48 are attached to the peripheral edge of the hand 44 at intervals in a circumferential direction. Each guide pin 48 is configured to be movable in the radial direction of the hand 44.

As depicted in FIG. 3 and FIG. 4, the wafer unloading unit 10 positions the hand 44 on the undersurface 4b side (lower side) of the wafer 4 within the wafer cassette 6 mounted on the wafer cassette table 8, thereafter generates a negative pressure on one surface side of the hand 44 on the basis of a Bernoulli effect by jetting a compressed air from the air jetting ports 46 of the hand 44, and thus sucks and supports the wafer 4 by the hand 44 from the undersurface 4b side in a noncontact manner. Horizontal movement of the wafer 4 sucked and supported by the hand 44 is regulated by each guide pin 48. Then, the wafer unloading unit 10 unloads the wafer 4 sucked and supported by the hand 44 from the wafer cassette 6 by moving the Y-axis movable member 32 and the transporting arm 42.

As depicted in FIG. 4, the wafer unloading unit 10 in the present embodiment includes a notch detecting mechanism 50 that detects the position of the notch 26 of the wafer 4. It suffices for the notch detecting mechanism 50 to have, for example, a configuration including a light emitting element 52 and a light receiving element 54 arranged at a distance from each other in the upward-downward direction and a driving source (not depicted) that rotates at least one of the guide pins 48 of the hand 44.

The light emitting element 52 and the light receiving element 54 can be attached to the Y-axis movable member 32 or a transportation path via appropriate brackets (not depicted). In addition, when the guide pin 48 is rotated by the driving source, the rotation of the guide pin 48 causes a rotation of the wafer 4 sucked and supported by the hand 44. In order to transmit the rotation from the guide pin 48 to the wafer 4 reliably, the outer circumferential surface of the guide pin 48 rotated by the driving source is preferably formed of an appropriate synthetic rubber.

The notch detecting mechanism 50 can detect the position of the notch 26 by rotating the wafer 4 by the driving source via the guide pin 48 in a state in which the wafer 4 is sucked and supported by the hand 44 and the outer circumference of the wafer 4 is positioned between the light emitting element 52 and the light receiving element 54. Thus, the orientation of the wafer 4 can be adjusted to an optional orientation.

As depicted in FIG. 3, the wafer table 12 is disposed so as to be adjacent to the wafer unloading unit 10. The wafer table 12 in the present embodiment includes an annular supporting portion 56 that supports the peripheral surplus region 20 of the wafer 4 and leaves a part on the inside of the peripheral surplus region 20 in a noncontact state, and a frame supporting portion 58 that is disposed on the periphery of the annular supporting portion 56 and supports an annular frame 64 (see FIG. 5) to be described later. A plurality of suction holes 60 arranged at intervals in a circumferential direction are formed in the upper surface of the annular supporting portion 56. Each suction hole 60 is connected to suction means (not depicted). A part radially inward of the annular supporting portion 56 in the wafer table 12 is a circular recess 62 recessed downward.

After the hand 44 inverts the top side and the underside of the wafer 4 by inverting the wafer 4 by 180°, and the wafer 4 is mounted on the wafer table 12 in a state in which the top surface 4a of the wafer 4 is oriented downward, the peripheral surplus region 20 of the wafer 4 is supported by the annular supporting portion 56, and the device region 18 of the wafer 4 is located on the recess 62. Therefore, even when the wafer 4 is mounted on the wafer table 12 in a state in which the top surface 4a having the devices 14 formed thereon is oriented downward, the devices 14 and the wafer table 12 do not come into contact with each other, so that damage to the devices 14 is prevented. In addition, after the wafer table 12 supports the peripheral surplus region 20 by the annular supporting portion 56, the wafer table 12 generates a suction force in each suction hole 60 by actuating the suction means, and thus sucks and holds the peripheral surplus region 20. The wafer table 12 thereby prevents positional displacement of the wafer 4.

Figure 5:
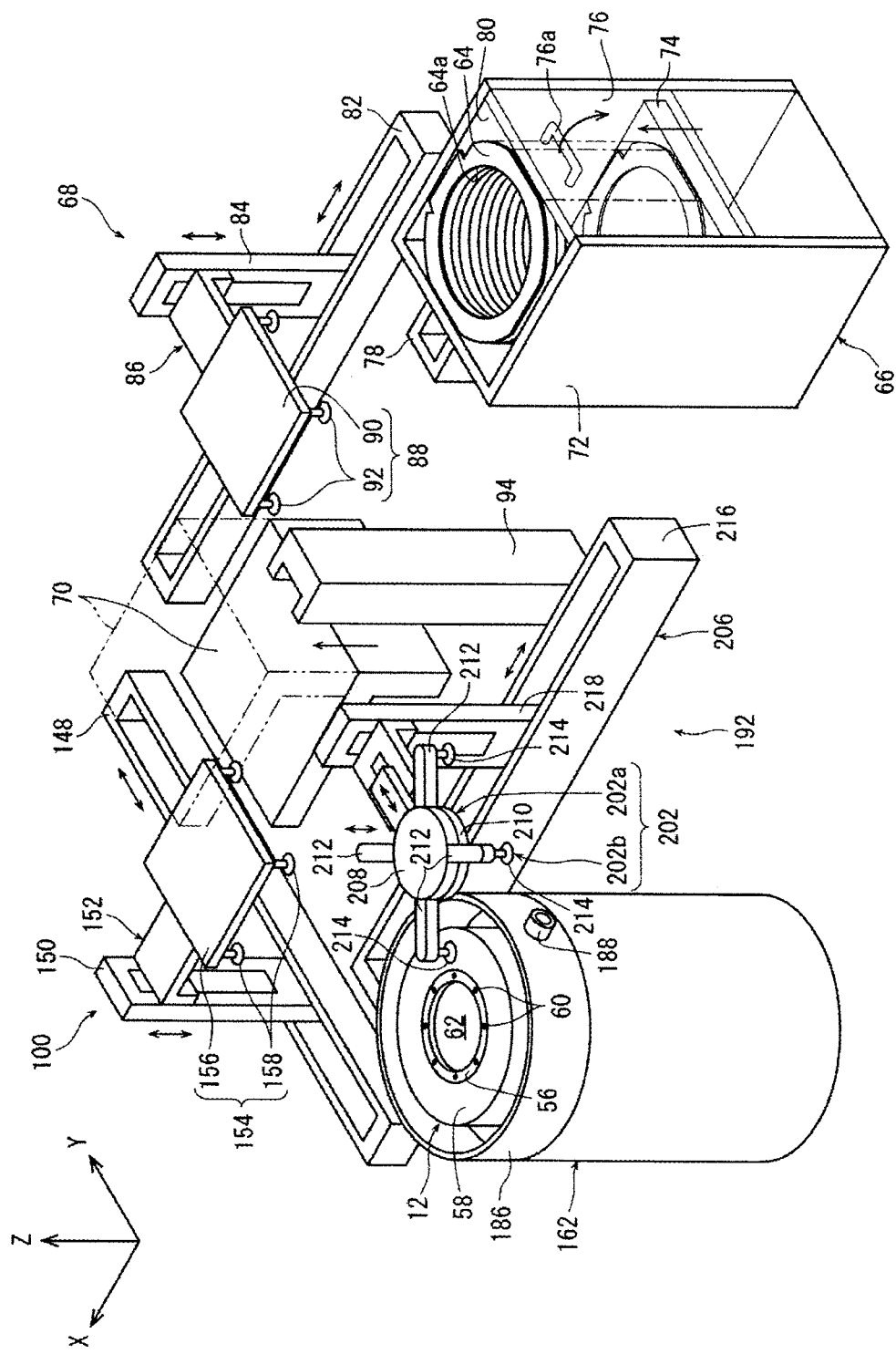
FIG. 5 is a perspective view of a frame housing unit and the like depicted in FIG. 1.

Making description with reference to FIG. 5, the processing apparatus 2 further includes a frame housing unit 66 that houses a plurality of annular frames or ring frames 64 in which an opening portion 64a for housing the wafer 4 is formed, a frame unloading unit 68 that unloads an annular frame 64 from the frame housing unit 66, and a frame table 70 that supports the annular frame 64 unloaded by the frame unloading unit 68.

As depicted in FIG. 5, the frame housing unit 66 in the present embodiment includes a housing 72, a raising and lowering plate 74 raisably and lowerably disposed within the housing 72, and raising and lowering means (not depicted) for raising or lowering the raising and lowering plate 74. A Z-axis guide member 78 extending in the Z-axis direction is disposed on a side surface on a far side in the X-axis direction of the housing 72 in FIG. 5. The raising and lowering plate 74 is raisably and lowerably supported by the Z-axis guide member 78. The raising and lowering means for raising or lowering the raising and lowering plate 74 is disposed within the Z-axis guide member 78. It suffices for the raising and lowering means to have, for example, a configuration including a ball screw coupled to the raising and lowering plate 74 and extending in the Z-axis direction and a motor that rotates the ball screw. A door 76 to which a handle 76a is attached is provided to a side surface on a near side in the X-axis direction of the housing 72 in FIG. 5. At the frame housing unit 66, when the handle 76a is gripped and the door 76 is opened, annular frames 64 can be housed within the housing 72. In addition, an opening portion 80 is provided to an upper end of the housing 72.

As depicted in FIG. 5, the annular frames 64 formed of a ferromagnetic substance are housed within the housing 72 so as to be stacked on the upper surface of the raising and lowering plate 74. The frame unloading unit 68 unloads an annular frame 64 at the top of the plurality of stacked annular frames 64 from the opening portion 80 of the housing 72. In addition, after the annular frame 64 is unloaded from the opening portion 80, the frame housing unit 66 raises the raising and lowering plate 74 by the raising and lowering means as appropriate, and positions an annular frame 64 at the top in such a position as to be unloadable by the frame unloading unit 68.

Continuing the description with reference to FIG. 5, the frame unloading unit 68 includes an X-axis guide member 82 fixed to an appropriate bracket (not depicted) and extending in the X-axis direction, an X-axis movable member 84 supported by the X-axis guide member 82 so as to be movable in the X-axis direction, an X-axis feed mechanism (not depicted) that moves the X-axis movable member 84 in the X-axis direction, a Z-axis movable member 86 supported by the X-axis movable member 84 so as to be movable in the Z-axis direction, and a Z-axis feed mechanism (not depicted) that moves the Z-axis movable member 86 in the Z-axis direction. It suffices for the X-axis feed mechanism of the frame unloading unit 68 to have a configuration including a ball screw coupled to the X-axis movable member 84 and extending in the X-axis direction and a motor that rotates the ball screw. It suffices for the Z-axis feed mechanism to have a configuration including a ball screw coupled to the Z-axis movable member 86 and extending in the Z-axis direction and a motor that rotates the ball screw.

The Z-axis movable member 86 of the frame unloading unit 68 has a holding unit 88 that holds the annular frame 64. The holding unit 88 in the present embodiment includes a rectangular board 90 and a plurality of suction pads 92 arranged on the lower surface of the board 90. Each suction pad 92 is connected to suction means (not depicted).

The frame unloading unit 68 sucks and holds the annular frame 64 at the top which annular frame 64 is housed in the frame housing unit 66 by the suction pads 92 of the holding unit 88, and thereafter moves the X-axis movable member 84 and the Z-axis movable member 86. The frame unloading unit 68 thereby unloads the sucked and held annular frame 64 at the top from the frame housing unit 66.

As depicted in FIG. 5, the frame table 70 is supported by a Z-axis guide member 94 so as to be raisable and lowerable between a lowered position indicated by a solid line and a raised position indicated by a chain double-dashed line. An appropriate driving source (for example, an air driving source or an electric driving source) that raises or lowers the frame table 70 between the lowered position and the raised position is attached to the Z-axis guide member 94. The frame table 70 is configured to receive the annular frame 64 unloaded by the frame unloading unit 68 at the lowered position.

As depicted in FIG. 1 and FIG. 5, the processing apparatus 2 includes a tape affixing unit 98 (see FIG. 1) that is disposed above the frame table 70 and affixes a tape 96 to the annular frame 64, a tape-affixed frame transporting unit 100 (see FIG. 5) that transports the annular frame 64 to which the tape 96 is affixed (which frame may hereinafter be referred to as a "tape-affixed frame 64'") to the wafer table 12, positions the opening portion 64a of the annular frame 64 at the undersurface 4b of the wafer 4 supported by the wafer table 12, and mounts the tape-affixed frame 64' on the wafer table 12, and a tape compression-bonding unit 102 (see FIG. 1) that compression-bonds the tape 96 of the tape-affixed frame 64' to the undersurface 4b of the wafer 4.

Figure 6A:
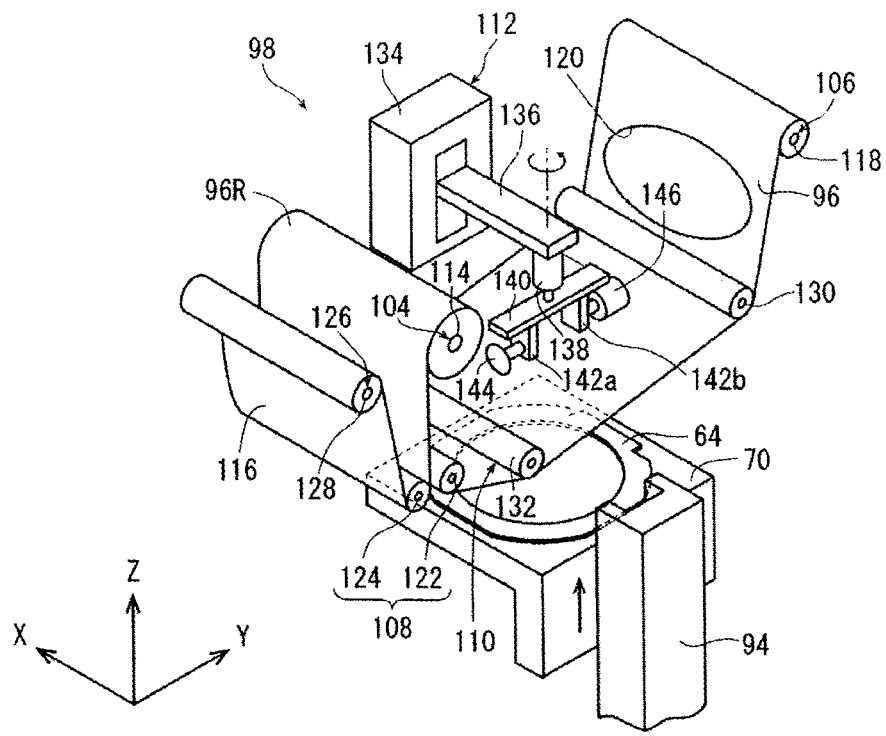
FIG. 6A is a perspective view of a tape affixing unit and the like in a state in which a frame table depicted in FIG. 1 is located at a lowered position.
Figure 6B:
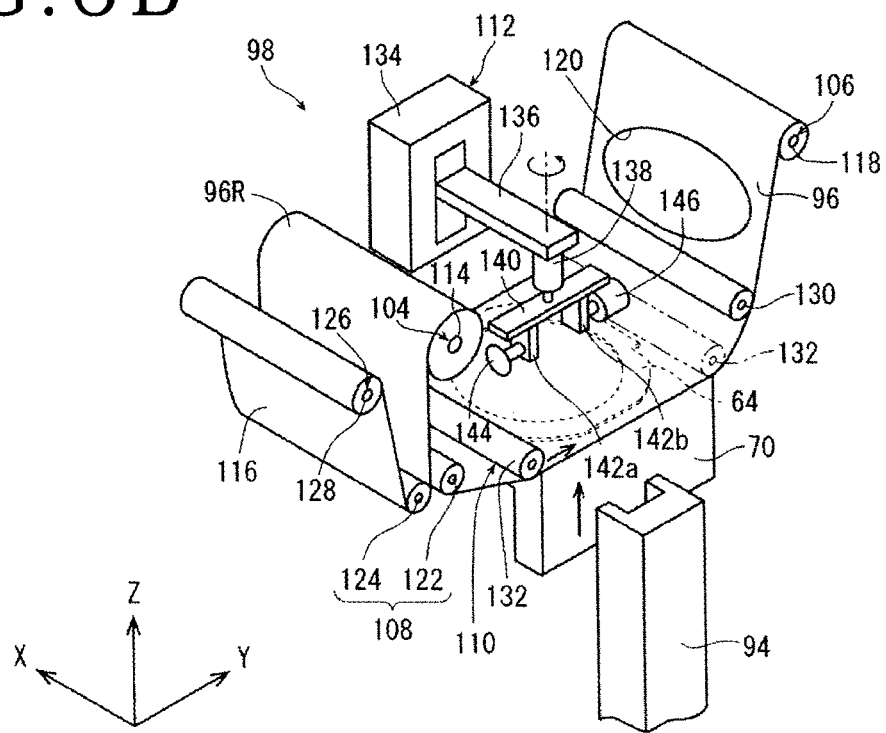
FIG. 6B is a perspective view of the tape affixing unit and the like in a state in which the frame table depicted in FIG. 1 is located at a raised position.

Making description with reference to FIG. 6A and FIG. 6B, the tape affixing unit 98 in the present embodiment includes a roll tape supporting unit 104 that supports a roll tape 96R wound with the tape 96 before usage, a tape winding unit 106 that winds the tape 96 already used, a tape extracting unit 108 that extracts the tape 96 from the roll tape 96R, a compression bonding unit 110 that compression-bonds the extracted tape 96 to the annular frame 64, and a cutting unit 112 that cuts the tape 96 extending off the outer circumference of the annular frame 64 along the annular frame 64.

As depicted in FIG. 6A and FIG. 6B, the roll tape supporting unit 104 includes a support roller 114 supported by an appropriate bracket (not depicted) so as to be rotatable about an axis extending in the X-axis direction. The support roller 114 supports the roll tape 96R wound in a cylindrical shape such that a peeling paper 116 for protecting the adhesive surface of the tape 96 is attached to the adhesive surface of the tape 96.

The tape winding unit 106 includes a winding roller 118 supported by an appropriate bracket (not depicted) so as to be rotatable about an axis extending in the X-axis direction and a motor (not depicted) that rotates the winding roller 118. As depicted in FIG. 6A and FIG. 6B, the tape winding unit 106 winds the already used tape 96, in which a circular opening portion 120 corresponding to a part affixed to the annular frame 64 is formed, by rotating the winding roller 118 by the motor.

Continuing the description with reference to FIG. 6A and FIG. 6B, the tape extracting unit 108 includes an extracting roller 122 disposed below the support roller 114 of the roll tape supporting unit 104, a motor (not depicted) that rotates the extracting roller 122, and a driven roller 124 that rotates as the extracting roller 122 rotates. The tape extracting unit 108 extracts the tape 96 sandwiched between the extracting roller 122 and the driven roller 124 from the roll tape 96R by rotating the driven roller 124 together with the extracting roller 122 by the motor.

The peeling paper 116 is peeled off the tape 96 passed between the extracting roller 122 and the driven roller 124. The peeled peeling paper 116 is wound by a peeling paper winding unit 126. The peeling paper winding unit 126 in the present embodiment includes a peeling paper winding roller 128 disposed above the driven roller 124 and a motor (not depicted) that rotates the peeling paper winding roller 128. In addition, the tape 96 from which the peeling paper 116 is peeled is guided to the winding roller 118 via a guide roller 130 disposed at a distance from the extracting roller 122 in the Y-axis direction.

The compression bonding unit 110 includes a pressing roller 132 disposed so as to be movable in the Y-axis direction and a Y-axis feed mechanism (not depicted) that moves the pressing roller 132 in the Y-axis direction. The Y-axis feed mechanism of the compression bonding unit 110 can be formed by an appropriate driving source (for example, an air driving source or an electric driving source).

As depicted in FIG. 6, the cutting unit 112 includes a Z-axis guide member 134 fixed to an appropriate bracket (not depicted) and extending in the Z-axis direction, a Z-axis movable member 136 supported by the Z-axis guide member 134 so as to be movable in the Z-axis direction, and a Z-axis feed mechanism (not depicted) that moves the Z-axis movable member 136 in the Z-axis direction. It suffices for the Z-axis feed mechanism of the cutting unit 112 to have a configuration including a ball screw coupled to the Z-axis movable member 136 and extending in the Z-axis direction and a motor that rotates the ball screw.

In addition, the cutting unit 112 includes a motor 138 fixed to the lower surface of a distal end of the Z-axis movable member 136 and an arm piece 140 rotated by the motor 138 about an axis extending in the Z-axis direction. A first and a second suspended piece 142a and 142b are attached to the lower surface of the arm piece 140 at a distance from each other. A circular cutter 144 is supported by the first suspended piece 142a so as to be rotatable about an axis orthogonal to the Z-axis direction. A pressing roller 146 is supported by the second suspended piece 142b so as to be rotatable about an axis orthogonal to the Z-axis direction.

Before the frame table 70 that has received the annular frame 64 from the frame unloading unit 68 is positioned from the lowered position (position depicted in FIG. 6A) to the raised position (position depicted in FIG. 6B), the tape affixing unit 98 extracts the tape 96 not yet used by the extracting roller 122 and the driven roller 124. Then, the frame table 70 is positioned at the raised position to such a degree that the pressing roller 132 of the compression bonding unit 110 can press the tape 96 against the annular frame 64. The annular frame 64 is brought into contact with the pressing roller 132 via the tape 96. Then, the pressing roller 132 is rolled in the Y-axis direction while the pressing roller 132 presses the adhesive surface of the tape 96 against the annular frame 64. The tape 96 extracted from the roll tape 96R by the tape extracting unit 108 can be thereby compression-bonded to the annular frame 64.

After the tape 96 is compression-bonded to the annular frame 64, the tape affixing unit 98 lowers the Z-axis movable member 136 of the cutting unit 112 by the Z-axis feed mechanism, presses the cutter 144 against the tape 96 on the annular frame 64, and presses the annular frame 64 from above the tape 96 by the pressing roller 146. Next, the arm piece 140 is rotated by the motor 138, and the cutter 144 and the pressing roller 146 are moved so as to describe a circle along the annular frame 64. The tape 96 extending off the outer circumference of the annular frame 64 can be thereby cut along the annular frame 64. In addition, because the pressing roller 146 presses the annular frame 64 from above the tape 96, positional displacement of the annular frame 64 and the tape 96 is prevented while the tape 96 is cut. Then, after the frame table 70 is lowered, the already used tape 96 in which a circular opening portion 120 corresponding to a part affixed to the annular frame 64 is formed is wound by the tape winding unit 106.

As depicted in FIG. 5, the tape-affixed frame transporting unit 100 includes a Y-axis guide member 148 fixed to an appropriate bracket (not depicted) and extending in the Y-axis direction, a Y-axis movable member 150 supported by the Y-axis guide member 148 so as to be movable in the Y-axis direction, a Y-axis feed mechanism (not depicted) that moves the Y-axis movable member 150 in the Y-axis direction, a Z-axis movable member 152 supported by the Y-axis movable member 150 so as to be movable in the Z-axis direction, and a Z-axis feed mechanism (not depicted)

that moves the Z-axis movable member 152 in the Z-axis direction. It suffices for the Y-axis feed mechanism of the tape-affixed frame transporting unit 100 to have a configuration including a ball screw coupled to the Y-axis movable member 150 and extending in the Y-axis direction and a motor that rotates the ball screw. It suffices for the Z-axis feed mechanism to have a configuration including a ball screw coupled to the Z-axis movable member 152 and extending in the Z-axis direction and a motor that rotates the ball screw.

The Z-axis movable member 152 of the tape-affixed frame transporting unit 100 has a holding unit 154 that holds the tape-affixed frame 64'. The holding unit 154 in the present embodiment includes a rectangular board 156 and a plurality of suction pads 158 provided to the lower surface of the board 156. Each suction pad 158 is connected to suction means (not depicted).

The tape-affixed frame transporting unit 100 sucks and holds, by each suction pad 158 of the holding unit 154, the upper surface of the tape-affixed frame 64' supported by the frame table 70 in a state in which the adhesive surface of the tape 96 is oriented downward. By moving the Y-axis movable member 150 and the Z-axis movable member 152, the tape-affixed frame transporting unit 100 transports the tape-affixed frame 64' sucked and held by the holding unit 154 from the frame table 70 to the wafer table 12, positions the opening portion 64a of the annular frame 64 at the undersurface 4b of the wafer 4 supported by the wafer table 12, and mounts the tape-affixed frame 64' onto the wafer table 12.

Figure 7:
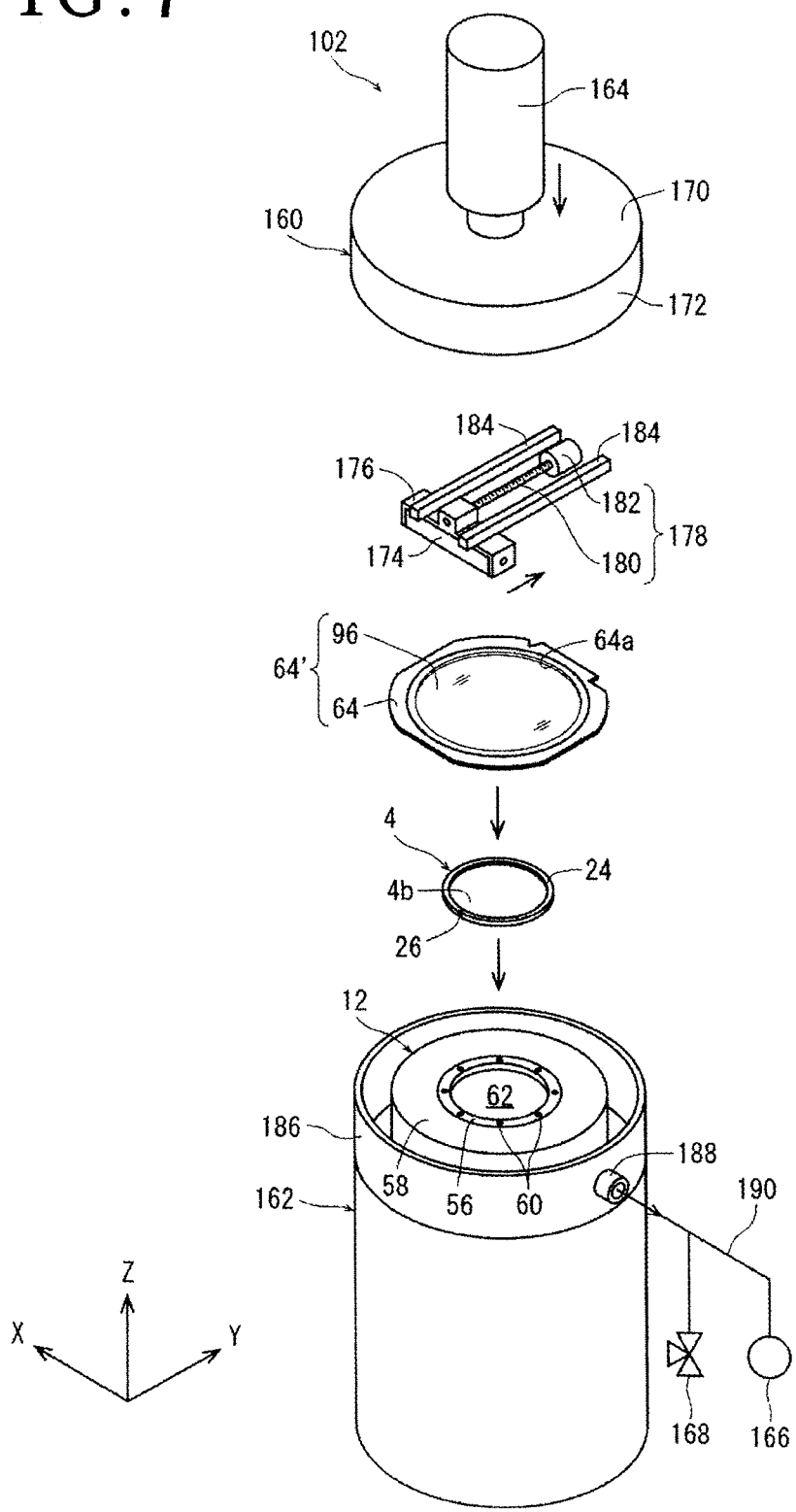
FIG. 7 is an exploded perspective view of a tape compression-bonding unit depicted in FIG. 1.
Figure 8:
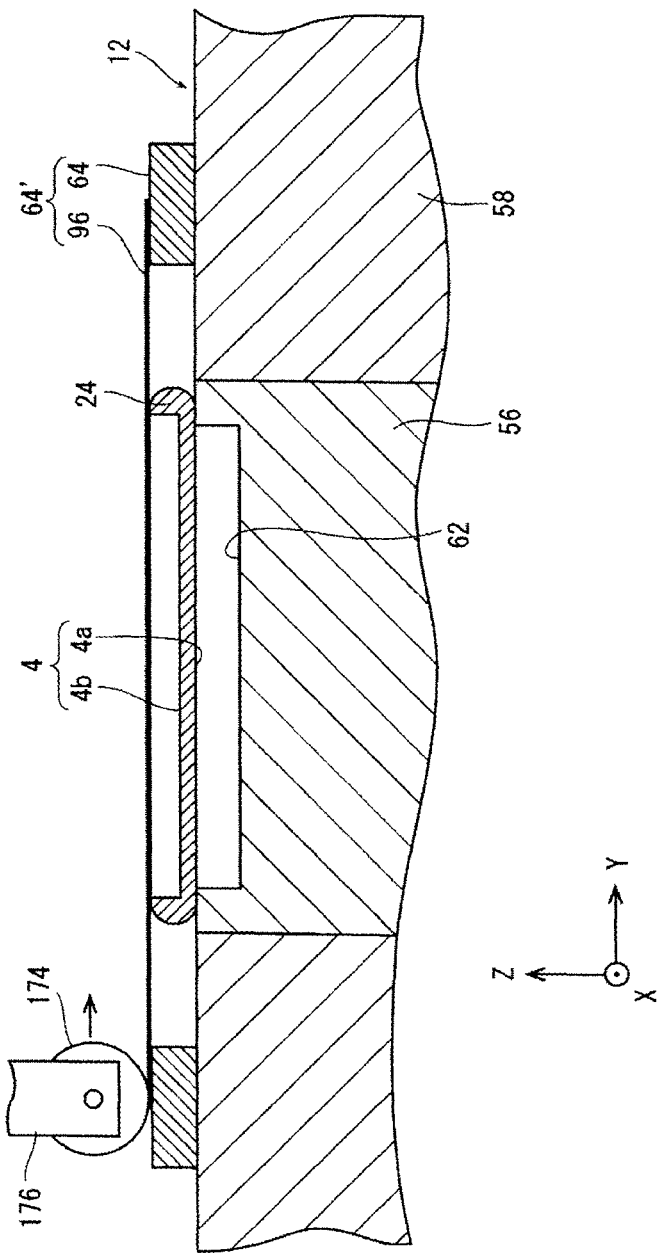
FIG. 8 is a sectional view depicting a state in which the pressing of a tape by a pressing roller is started in a tape compression-bonding step.
Figure 9:
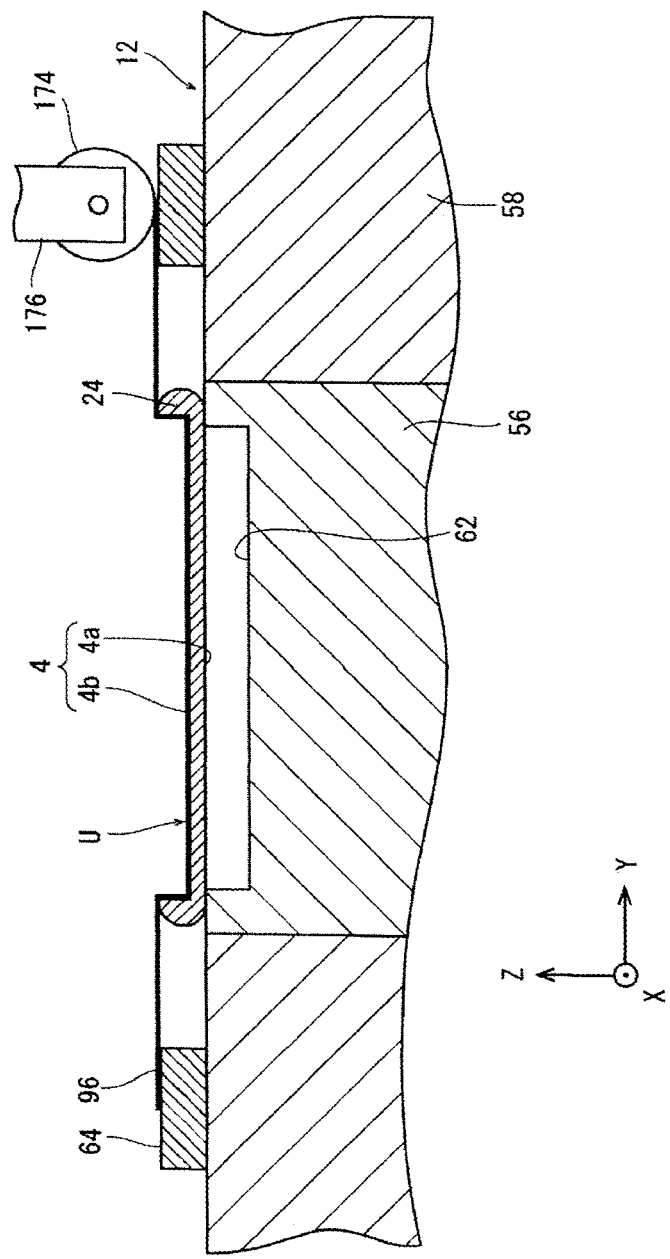
FIG. 9 is a sectional view depicting a state in which the pressing of the tape by the pressing roller is ended in the tape compression-bonding step.

The tape compression-bonding unit 102 will be described with reference to FIGS. 7 to 9. As depicted in FIG. 7, the tape compression-bonding unit 102 includes an upper chamber 160 disposed above the wafer table 12, a lower chamber 162 that houses the wafer table 12, a raising and lowering mechanism 164 that produces a closed state in which the upper chamber 160 is lowered and set in contact with the lower chamber 162 and an opened state in which the upper chamber 160 is separated from the lower chamber 162, a vacuum unit 166 that evacuates the upper chamber 160 and the lower chamber 162 in the closed state, and an atmosphere opening unit 168 that opens the upper chamber 160 and the lower chamber 162 to the atmosphere.

As depicted in FIG. 7, the upper chamber 160 in the present embodiment includes a circular top 170 and a cylindrical side wall 172 suspended from the circumferential edge of the top 170. The raising and lowering mechanism 164 that can be formed by an appropriate actuator such as an air cylinder is fitted to the upper surface of the top 170. Arranged in a housing space defined by the lower surface of the top 170 and the inner circumferential surface of the side wall 172 are a pressing roller 174 for pressing the tape 96 of the tape-affixed frame 64' against the undersurface 4b of the wafer 4 supported by the wafer table 12, a supporting piece 176 that rotatably supports the pressing roller 174, and a Y-axis feed mechanism 178 that moves the supporting piece 176 in the Y-axis direction.

The Y-axis feed mechanism 178 includes a ball screw 180 coupled to the supporting piece 176 and extending in the Y-axis direction and a motor 182 that rotates the ball screw 180. The Y-axis feed mechanism 178 converts rotary motion of the motor 182 into rectilinear motion by the ball screw 180, and transmits the rectilinear motion to the supporting piece 176. The Y-axis feed mechanism 178 thereby moves the supporting piece 176 along a pair of guide rails 184 extending in the Y-axis direction.

As depicted in FIG. 7, the lower chamber 162 has a cylindrical side wall 186. An upper portion of the side wall 186 is opened. A lower portion of the side wall 186 is closed. A connection opening 188 is formed in the side wall 186. A vacuum unit 166 that can be formed by an appropriate vacuum pump is connected to the connection opening 188 via a flow passage 190. The flow passage 190 is provided with the atmosphere opening unit 168 that can be formed by an appropriate valve that can open the flow passage 190 to the atmosphere.

The tape compression-bonding unit 102 lowers the upper chamber 160 by the raising and lowering mechanism 164 in a state in which the tape 96 of the tape-affixed frame 64' is positioned at the undersurface 4b of the wafer 4 supported by the wafer table 12. The tape compression-bonding unit 102 thereby brings a lower end of the side wall 172 of the upper chamber 160 in contact with an upper end of the side wall 186 of the lower chamber 162, sets the upper chamber 160 and the lower chamber 162 in the closed state, and brings the pressing roller 174 in contact with the tape-affixed frame 64'.

Next, the tape compression-bonding unit 102 evacuates the inside of the upper chamber 160 and the lower chamber 162 by actuating a vacuum pump constituting the vacuum unit 166 in a state in which the valve constituting the atmosphere opening unit 168 is closed. As depicted in FIG. 8 and FIG. 9, the tape compression-bonding unit 102 thereafter rolls the pressing roller 174 in the Y-axis direction by the Y-axis feed mechanism 178. The tape compression-bonding unit 102 thereby compression-bonds the tape 96 to the undersurface 4b of the wafer 4 to produce a frame unit U.

When the pressing roller 174 compression-bonds the tape 96 to the undersurface 4b of the wafer 4, a small gap is formed between the wafer 4 and the tape 96 at the base of the ring-shaped reinforcing portion 24. However, because the wafer 4 and the tape 96 are compression-bonded to each other in a state in which the inner of the upper chamber 160 and the lower chamber 162 is evacuated, the pressure of the small gap between the wafer 4 and the tape 96 is lower than an atmospheric pressure. When the atmosphere opening unit 168 is opened after the tape 96 is compression-bonded, the atmospheric pressure presses the tape 96 against the wafer 4. Consequently, the gap between the wafer 4 and the tape 96 at the base of the reinforcing portion 24 is eliminated, and the tape 96 closely adheres to the undersurface 4b of the wafer 4 along the base of the reinforcing portion 24.

Figure 10:
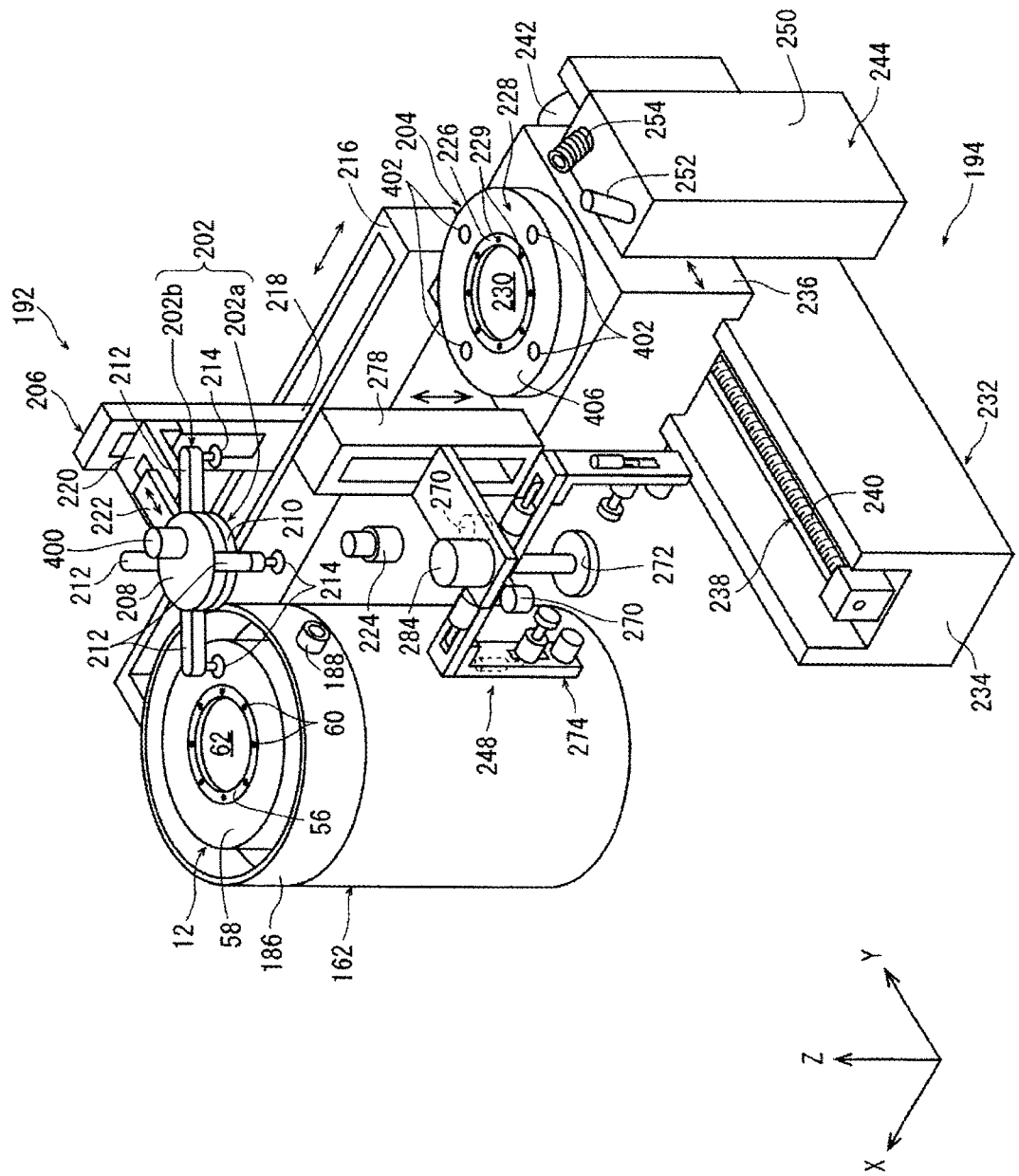
FIG. 10 is a perspective view of a reinforcing portion removing unit depicted in FIG. 1.

As depicted in FIG. 1 and FIG. 10, the processing apparatus 2 further includes a frame unit unloading unit 192 that unloads, from the wafer table 12, the frame unit U in which the tape 96 of the tape-affixed frame 64' and the undersurface 4b of the wafer 4 are compression-bonded to each other by the tape compression-bonding unit 102, a reinforcing portion removing unit 194 that cuts and removes the ring-shaped reinforcing portion 24 from the wafer 4 of the frame unit U unloaded by the frame unit unloading unit 192, a no-ring unit unloading unit 196 (see FIG. 1) that unloads the no-ring unit from which the ring-shaped reinforcing portion 24 is removed from the reinforcing portion removing unit 194, and a frame cassette table 200 (see FIG. 1) mounted with a frame cassette 198 that houses the no-ring unit unloaded by the no-ring unit unloading unit 196.

As depicted in FIG. 10, the frame unit unloading unit 192 in the present embodiment includes a frame unit holding unit 202 including a wafer holding unit 202a that holds the wafer 4 while exposing the whole or a part of the periphery of the wafer 4 and a frame holding unit 202b that holds the annular frame 64, and a transporting unit 206 that transports the frame unit holding unit 202 to a temporary placement table 204.

The wafer holding unit 202a of the frame unit holding unit 202 includes a circular board 208 and a suction piece 210 fitted to the lower surface of the board 208. A plurality of suction holes (not depicted) are formed in the lower surface of the suction piece 210. Each suction hole is connected to suction means (not depicted). The shape of the suction piece 210 may, for example, be a circular shape having a smaller diameter than the wafer 4. The frame holding unit 202b includes a plurality of projecting pieces (four projecting pieces in the present embodiment) 212 projecting radially outward from the peripheral edge of the board 208 of the wafer holding unit 202a at intervals in a circumferential direction and suction pads 214 attached to the lower surfaces of the projecting pieces 212. Each suction pad 214 is connected to suction means (not depicted).

The transporting unit 206 includes an X-axis guide member 216 fixed to an appropriate bracket (not depicted) and extending in the X-axis direction, an X-axis movable member 218 supported by the X-axis guide member 216 so as to be movable in the X-axis direction, an X-axis feed mechanism (not depicted) that moves the X-axis movable member 218 in the X-axis direction, a Z-axis movable member 220 supported by the X-axis movable member 218 so as to be movable in the Z-axis direction, a Z-axis feed mechanism (not depicted) that moves the Z-axis movable member 220 in the Z-axis direction, a Y-axis movable member 222 supported by the Z-axis movable member 220 so as to be movable in the Y-axis direction, and a Y-axis feed mechanism (not depicted) that moves the Y-axis movable member 222 in the Y-axis direction. The board 208 of the wafer holding unit 202a is coupled to a distal end of the Y-axis movable member 222. It suffices for each of the X-axis, Y-axis, and Z-axis feed mechanisms of the transporting unit 206 to have a configuration including a ball screw and a motor that rotates the ball screw.

The frame unit unloading unit 192 further includes an imaging unit 224 that images the periphery of the wafer 4 of the frame unit U held by the frame unit holding unit 202 and an illuminating unit 400 that faces the imaging unit 224 and is disposed at a position at which the wafer 4 is interposed between the illuminating unit 400 and the imaging unit 224. The imaging unit 224 in the present embodiment is disposed between the wafer table 12 and the temporary placement table 204, and images the periphery of the wafer 4 of the frame unit U held by the frame unit holding unit 202 from below the wafer 4.

The frame unit unloading unit 192 unloads the frame unit U held by the frame unit holding unit 202 from the wafer table 12 by actuating the transporting unit 206 in a state in which the suction piece 210 of the wafer holding unit 202a sucks and holds the wafer 4 from the undersurface 4b side (tape 96 side) and the suction pads 214 of the frame holding unit 202b suck and hold the annular frame 64. When the suction piece 210 of the wafer holding unit 202a sucks and holds the wafer 4, the suction piece 210 does not cover all of the undersurface 4b side of the wafer 4, that is, the undersurface 4b of the wafer 4 has a part not sucked by the suction piece 210 and the whole or a part of the periphery of the wafer 4 is exposed.

In addition, the frame unit unloading unit 192 in the present embodiment actuates the transporting unit 206, and measures the coordinates of at least three points of the periphery of the wafer 4 by imaging, by the imaging unit 224, at least three positions of the exposed part (part not covered by the suction piece 210) of the periphery of the wafer 4 of the frame unit U held by the frame unit holding unit 202. The frame unit unloading unit 192 obtains the central coordinates of the wafer 4 on the basis of the measured coordinates of the three points. In the present embodiment, because the whole or a part of the periphery of the wafer 4 sucked and held by the suction piece 210 is exposed, the contour of the wafer 4 can be imaged clearly by illuminating the exposed part of the periphery of the wafer 4 by the illuminating unit 400 from above the wafer 4, and imaging the exposed part of the periphery of the wafer 4 by the imaging unit 224 from below the wafer 4. Thus, the central coordinates of the wafer 4 can be obtained precisely. Then, the frame unit unloading unit 192 makes the center of the wafer 4 coincide with the center of the temporary placement table 204, and temporarily places the frame unit U on the temporary placement table 204.

As depicted in FIG. 10, the temporary placement table 204 is disposed at a distance from the wafer table 12 in the X-axis direction. The temporary placement table 204 in the present embodiment includes an annular supporting portion 226 that supports the peripheral surplus region 20 of the wafer 4 of the frame unit U and leaves a part on the inside of the peripheral surplus region 20 in a noncontact state, and a frame supporting portion 228 that is disposed on the periphery of the annular supporting portion 226 and supports the annular frame 64. The frame supporting portion 228 includes strong permanent magnets 402 having a stronger magnetic force than permanent magnets of a first raising and lowering table 246 to be described later, and a detaching unit 404 that detaches the annular frame magnetically held by the strong permanent magnets 402.

As depicted in FIG. 10, the strong permanent magnets 402 are housed in an upper end of a frame body 406 of the frame supporting portion 228 at intervals in the circumferential direction. Making description with reference to FIG. 11A and FIG. 11B, a strong permanent magnet 402 in the present embodiment includes a cylindrical main portion 402a that magnetically holds the annular frame by an upper end surface and an annular flange portion 402b that extends radially outward from a lower end of the main portion 402a. In addition, the strong permanent magnet 402 is housed in a housing hole 406a of the frame body 406 so as to be movable in the upward-downward direction between a raised position depicted in FIG. 11A and a lowered position depicted in FIG. 11B. As is understood by reference to FIGS. 11A and 11B, the upper surface of the strong permanent magnet 402 and the upper surface of the frame body 406 are flush with each other at the raised position, and the upper surface of the strong permanent magnet 402 is positioned, for example, approximately 5 mm below the upper surface of the frame body 406 at the lowered position. Incidentally, the frame body 406 is formed of a non-magnetic substance.

Figure 11A:
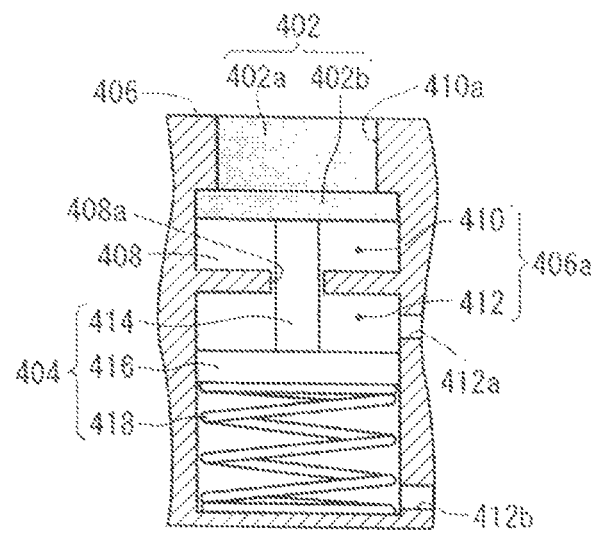
FIG. 11A is a sectional view of a frame supporting portion in a case where strong permanent magnets of a temporary placement table depicted in FIG. 1 are located at a raised position.
Figure 11B:
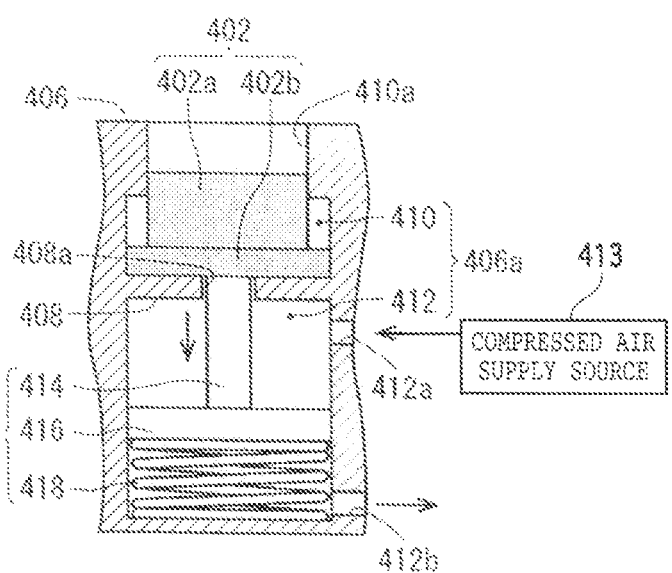
FIG. 11B is a sectional view of the frame supporting portion in a case where the strong permanent magnets of the temporary placement table depicted in FIG. 1 are located at a lowered position.

As depicted in FIGS. 11A and 11B, a partition wall 408 is provided in an intermediate portion in the upward-downward direction of the housing hole 406a of the frame body 406. The partition wall 408 partitions the housing hole 406a of the frame body 406 into an upper side housing chamber 410 housing the strong permanent magnet 402 and a lower side housing chamber 412 housing the detaching unit 404. A through hole 408a is formed in a central portion of the partition wall 408.

A projecting portion 410a that protrudes radially inward is formed on the upper end side of the upper side housing chamber 410. As depicted in FIG. 11A, when an upward force is applied from the detaching unit 404 to the strong permanent magnet 402, an upper end of the flange portion 402b of the strong permanent magnet 402 is caught on a lower end of the projecting portion 410a, and thereby the strong permanent magnet 402 is positioned at the raised position. On the other hand, as depicted in FIG. 11B, when a downward force is applied from the detaching unit 404 to the strong permanent magnet 402, the lower surface of the strong permanent magnet 402 comes into contact with the upper surface of the partition wall 408, and thereby the strong permanent magnet 402 is positioned at the lowered position. In addition, an upper opening 412a and a lower opening 412b are formed in the lower side housing chamber 412 at a distance from each other in the upward-downward direction.

Continuing the description with reference to FIGS. 11A and 11B, the detaching unit 404 in the present embodiment includes a rod 414 extending downward from a lower end of the strong permanent magnet 402 through the through hole 408a, a piston 416 fixed to a lower end of the rod 414 and disposed in the lower side housing chamber 412, a coil spring 418 disposed under the piston 416, and a compressed air supply source 413 connected to the upper opening 412a of the lower side housing chamber 412.

The detaching unit 404 applies an upward force to the strong permanent magnet 402 by stopping supply of compressed air from the compressed air supply source 413 to the lower side housing chamber 412 and pushing up the piston 416 upward by the coil spring 418. Consequently, the detaching unit 404 raises the strong permanent magnet 402 with respect to the frame body 406, and positions the strong permanent magnet 402 at the raised position at which the strong permanent magnet 402 can magnetically hold the annular frame 64 mounted on the frame supporting portion 228. In addition, the detaching unit 404 applies a downward force to the strong permanent magnet 402 by supplying compressed air from the compressed air supply source 413 to the lower side housing chamber 412 and thereby depressing the piston 416 downward. Consequently, the detaching unit 404 lowers the strong permanent magnet 402 with respect to the frame body 406, and positions the strong permanent magnet 402 at the lowered position at which the annular frame 64 mounted on the frame supporting portion 228 can be detached from the strong permanent magnet 402. Incidentally, an air is discharged from the lower opening 412b by depressing the piston 416 downward.

As depicted in FIG. 10, a plurality of suction holes 229 arranged at intervals in the circumferential direction are formed in the upper surface of the annular supporting portion 226 of the temporary placement table 204. Each suction hole 229 is connected to suction means (not depicted). In addition, the annular supporting portion 226 is configured to be raisable and lowerable between a raised position (position depicted in FIG. 10) at which the upper surface of the annular supporting portion 226 and the upper surface of the frame supporting portion 228 are flush with each other and a lowered position at which the upper surface of the annular supporting portion 226 is positioned, for example, approximately 5 to 10 mm below the upper surface of the frame supporting portion 228. It suffices for raising and lowering means (not depicted) for raising and lowering the annular supporting portion 226 to be an appropriate actuator such as an air cylinder. A part radially inward of the annular supporting portion 226 is a circular recess 230 recessed downward. It is preferable that the frame supporting portion 228 of the temporary placement table 204 include a heater (not depicted), and that the tape 96 be softened by heating the tape 96 of the frame unit U temporarily placed on the temporary placement table 204 by the heater so that the tape 96 is made to adhere to the base of the ring-shaped reinforcing portion 24 more closely due to the atmospheric pressure.

The processing apparatus 2 in the present embodiment includes a temporary placement table transporting unit 232 that transports the temporary placement table 204 in the Y-axis direction. The temporary placement table transporting unit 232 includes a Y-axis guide member 234 extending in the Y-axis direction, a Y-axis movable member 236 supported by the Y-axis guide member 234 so as to be movable in the Y-axis direction, and a Y-axis feed mechanism 238 that moves the Y-axis movable member 236 in the Y-axis direction. The temporary placement table 204 is fixed to an upper portion of the Y-axis movable member 236. The Y-axis feed mechanism 238 includes a ball screw 240 coupled to the Y-axis movable member 236 and extending in the Y-axis direction and a motor 242 that rotates the ball screw 240. The temporary placement table transporting unit 232 converts rotary motion of the motor 242 into rectilinear motion by the ball screw 240, and transmits the rectilinear motion to the Y-axis movable member 236. The temporary placement table transporting unit 232 thereby transports the temporary placement table 204 in the Y-axis direction together with the Y-axis movable member 236.

As depicted in FIG. 1 and FIG. 10, the reinforcing portion removing unit 194 includes a laser beam irradiating unit 244 that forms a cutting groove by applying a laser beam to the base of the ring-shaped reinforcing portion 24 formed on the periphery of the wafer 4, a first raising and lowering table 246 (see FIG. 1) that holds and raises the frame unit U temporarily placed on the temporary placement table 204, and positions the frame unit U at the laser beam irradiating unit 244 by moving in the X-axis direction, and a separating unit 248 that separates the ring-shaped reinforcing portion 24 from the cutting groove.

As depicted in FIG. 10, the laser beam irradiating unit 244 includes a housing 250 disposed so as to be adjacent to the temporary placement table 204 in the X-axis direction, a laser oscillator (not depicted) that is housed in the housing 250 and oscillates a laser, a condenser 252 that condenses a laser beam emitted from the laser oscillator, and applies the laser beam to the base of the ring-shaped reinforcing portion 24 formed on the periphery of the wafer 4, a suction nozzle 254 that sucks debris produced when the wafer 4 is irradiated with the laser beam, and suction means (not depicted) connected to the suction nozzle 254.

The condenser 252 extends upward from the upper surface of the housing 250 so as to be inclined to the suction nozzle 254 side. This suppresses falling of the debris produced at the time of application of the laser beam onto the condenser 252. In addition, the suction nozzle 254 extends upward from the upper surface of the housing 250 so as to be inclined to the condenser 252 side.

Figure 12:
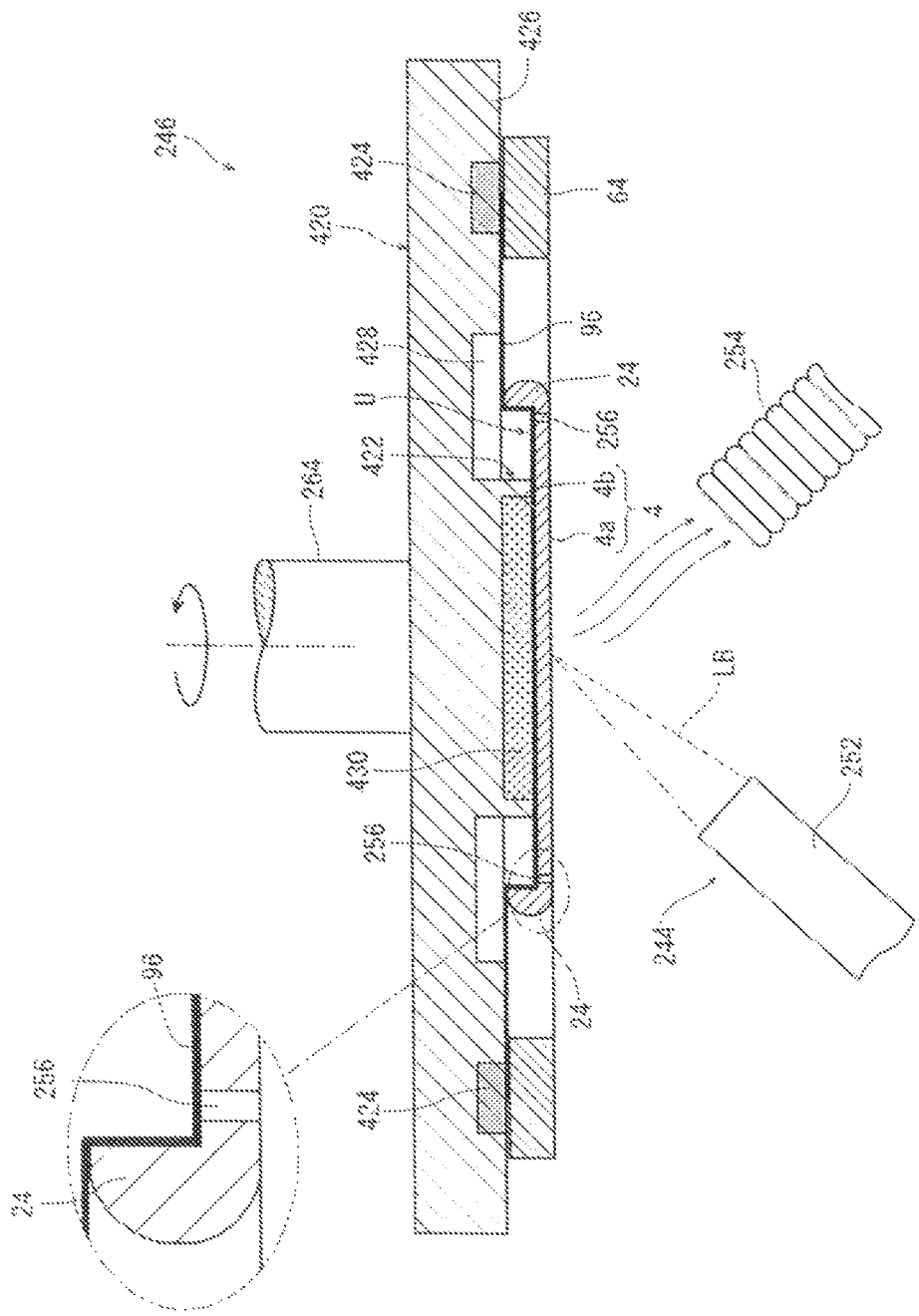
FIG. 12 is a schematic diagram depicting a state in which the base of the wafer is irradiated with a laser beam in a reinforcing portion removing step.

As depicted in FIG. 12, the laser beam irradiating unit 244 applies a laser beam LB to the base of the ring-shaped reinforcing portion 24 formed on the periphery of the wafer 4 while the frame unit U held by the first raising and lowering table 246 is rotated. The laser beam irradiating unit 244 thus forms a ring-shaped cutting groove 256 along the base of the reinforcing portion 24 by ablation processing. In addition, the laser beam irradiating unit 244 sucks the debris produced by the ablation processing by the suction nozzle 254.

As depicted in FIG. 1, the first raising and lowering table 246 is disposed above the temporary placement table 204 so as to be movable in the X-axis direction and movable in the Z-axis direction. Making description with reference to FIGS.

13A and 13B, the first raising and lowering table 246 includes an X-axis guide member 258 fixed to an appropriate bracket (not depicted) and extending in the X-axis direction, an X-axis movable member 260 supported by the X-axis guide member 258 so as to be movable in the X-axis direction, an X-axis feed mechanism (not depicted) that moves the X-axis movable member 260 in the X-axis direction, a Z-axis movable member 262 supported by the X-axis movable member 260 so as to be movable in the Z-axis direction, and a Z-axis feed mechanism (not depicted) that moves the Z-axis movable member 262 in the Z-axis direction. It suffices for each of the X-axis and Z-axis feed mechanisms of the first raising and lowering table 246 to have a configuration including a ball screw and a motor that rotates the ball screw.

A support shaft 264 extending downward is rotatably supported from the lower surface of a distal end of the Z-axis movable member 262. A motor 266 that rotates the support shaft 264 about an axis extending in the Z-axis direction is attached to the upper surface of the distal end of the Z-axis movable member 262. A circular holding member 420 is fixed to a lower end of the support shaft 264.

Figure 13A:
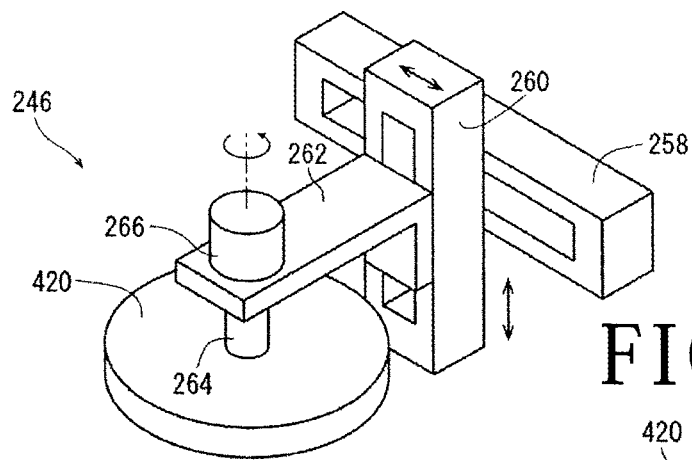
FIG. 13A is a perspective view of a first raising and lowering table of the reinforcing portion removing unit depicted in FIG. 1.
Figure 13B:
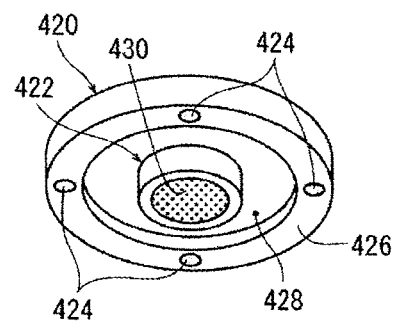
FIG. 13B is a perspective view of a holding member depicted in FIG. 13A as viewed from below.

As depicted in FIG. 13B, the holding member 420 includes a small-diameter wafer holding unit 422 that is smaller than the outside diameter of the wafer 4 and exposes the ring-shaped reinforcing portion 24, a frame supporting portion 426 including permanent magnets 424 that magnetically hold the annular frame 64, and a space 428 that diffuses leakage light of the laser beam between the wafer holding unit 422 and the frame supporting portion 426.

Continuing the description with reference to FIG. 13B, the wafer holding unit 422 is disposed on a central portion of the lower surface of the holding member 420, and the diameter of the wafer holding unit 422 is slightly smaller than the diameter of the device region (part on the inside of the ring-shaped reinforcing portion 24) of the wafer 4. A circular suction chuck 430 formed of a porous material is provided to a lower end of the wafer holding unit 422. The suction chuck 430 is connected to suction means (not depicted).

The frame supporting portion 426 is disposed on a peripheral portion of the holding member 420. A plurality of permanent magnets (four permanent magnets in the present embodiment) 424 are provided to a lower end of the frame supporting portion 426 at intervals in the circumferential direction. The magnetic force of the permanent magnets 424 is weaker than the magnetic force of the strong permanent magnets 402 of the temporary placement table 204. In addition, an annular recess recessed upward is formed between the wafer holding unit 422 and the frame supporting portion 426 on the lower surface of the holding member 420. This recess forms the space 428 that diffuses leakage light of the laser beam.

After the permanent magnets 424 of the frame supporting portion 426 hold the annular frame 64 of the frame unit U in which the tape 96 is heated by the heater of the frame supporting unit 228 of the temporary placement table 204 and the tape 96 thus closely adheres to the base of the ring-shaped reinforcing portion 24, and the suction chuck 430 of the wafer holding unit 422 sucks and holds the wafer 4, the first raising and lowering table 246 raises the frame unit U held by the holding member 420 and moves the frame unit U in the X-axis direction by moving the Z-axis movable member 262 and the X-axis movable member 260. The first raising and lowering table 246 thereby positions the frame unit U at the laser beam irradiating unit 244.

Incidentally, when the holding member 420 of the first raising and lowering table 246 holds the frame unit U, the strong permanent magnets 402 are separated from the annular frame 64 by positioning the strong permanent magnets 402 of the frame supporting unit 228 of the temporary placement table 204 at the lowered position, so that the magnetic force acting on the annular frame 64 mounted on the temporary placement table 204 from the permanent magnets 424 of the first raising and lowering table 246 which permanent magnets are in contact with the annular frame 64 is stronger than the magnetic force acting on the annular frame 64 mounted on the temporary placement table 204 from the strong permanent magnets 402 of the temporary placement table 204.

In addition, the first raising and lowering table 246 rotates the frame unit U held by the holding member 420 by actuating the motor 266 when the laser beam irradiating unit 244 irradiates the wafer 4 with the laser beam LB. Further, the first raising and lowering table 246 temporarily places the frame unit U in which the cutting groove 256 is formed at the base of the reinforcing portion 24 onto the temporary placement table 204 by moving the frame unit U in the X-axis direction and the Z-axis direction. Incidentally, the debris adheres to the periphery of the wafer 4 due to the application of the laser beam LB. It is thus preferable to make only the strong permanent magnets 402 act and stop the suction of the annular supporting portion 226 of the temporary placement table 204 when the frame unit U is transferred from the first raising and lowering table 246 to the temporary placement table 204. This prevents adhesion of the debris to the suction holes 229 of the annular supporting portion 226. Further, it is preferable to position the annular supporting portion 226 at the lowered position from a viewpoint of preventing adhesion of the debris to the suction holes 229.

As depicted in FIG. 1, the separating unit 248 is disposed at a distance from the first raising and lowering table 246 in the Y-axis direction in a movable range of the Y-axis direction of the temporary placement table 204. Making description with reference to FIG. 14 and FIG. 16, the separating unit 248 includes ultraviolet ray irradiating units 270 (see FIG. 14) that reduce the adhesive force of the tape 96 by irradiating a part of the tape 96 which part corresponds to the cutting groove 256 with ultraviolet rays, a second raising and lowering table 272 (see FIG. 14) that sucks and holds the inside of the wafer 4 while exposing the ring-shaped reinforcing portion 24 to the periphery of the second raising and lowering table 272, and supports the annular frame 64, a separator 274 (see FIG. 14) that separates the ring-shaped reinforcing portion 24 by acting on the periphery of the ring-shaped reinforcing portion 24, and a discarding unit 276 (see FIG. 16) onto which the separated ring-shaped reinforcing portion 24 is discarded.

Figure 14:
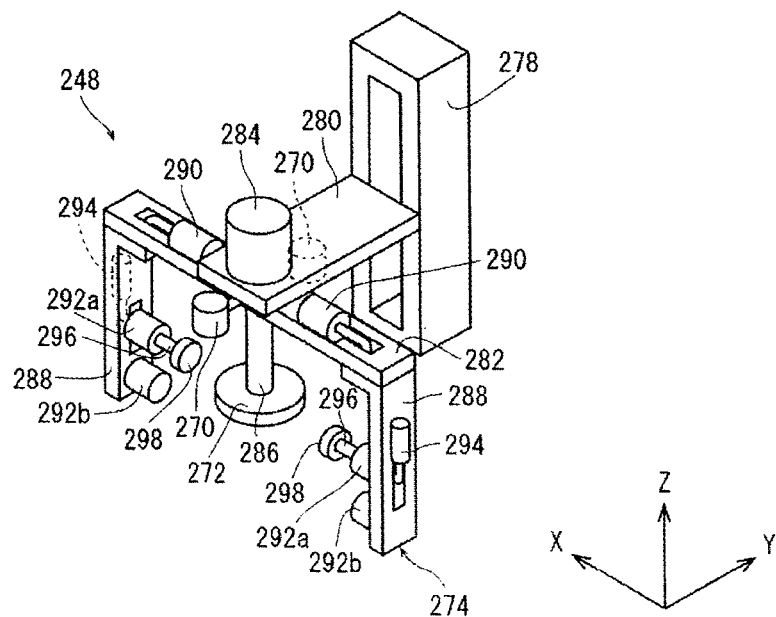
FIG. 14 is a perspective view of a separating unit of the reinforcing portion removing unit depicted in FIG. 1.

As depicted in FIG. 14, the separating unit 248 in the present embodiment includes a Z-axis guide member 278 fixed to an appropriate bracket (not depicted) and extending in the Z-axis direction, a Z-axis movable member 280 supported by the Z-axis guide member 278 so as to be movable in the Z-axis direction, and a Z-axis feed mechanism (not depicted) that moves the Z-axis movable member 280 in the Z-axis direction. It suffices for the Z-axis feed mechanism to have a configuration including a ball screw coupled to the Z-axis movable member 280 and extending in the Z-axis direction and a motor that rotates the ball screw.

The lower surface of a distal end of the Z-axis movable member 280 supports a support piece 282, and rotatably supports a support shaft 286. The above-described second raising and lowering table 272 is coupled to the support shaft 286. A motor 284 that rotates the second raising and lowering table 272 together with the support shaft 286 is attached to the upper surface of the distal end of the Z-axis movable member 280. A pair of the above-described ultraviolet ray irradiating units 270 is attached to the support piece 282 in the present embodiment at a distance from each other in the Y-axis direction.

The second raising and lowering table 272 has a circular shape. The diameter of the second raising and lowering table 272 is slightly smaller than the diameter of the device region 18 (part on the inside of the ring-shaped reinforcing portion 24) of the wafer 4. A plurality of suction holes (not depicted) are formed in the lower surface of the second raising and lowering table 272. Each suction hole is connected to suction means.

In addition, the above-described separator 274 is fitted to the support piece 282. The separator 274 includes a pair of movable pieces 288 arranged on the lower surface of the support piece 282 at a distance from each other so as to be movable in the longitudinal direction of the support piece 282 and a pair of feed means 290 for moving the pair of movable pieces 288. Each of the pair of feed means 290 can be formed by an appropriate actuator such as an air cylinder, or an electric cylinder.

The separator 274 includes a pair of sandwiching rollers 292a and 292b supported by each movable piece 288 at a distance from each other in the upward-downward direction and a Z-axis feed mechanism 294 that moves the upper sandwiching roller 292a in the Z-axis direction. The Z-axis feed mechanism 294 can be formed by an appropriate actuator such as an air cylinder, or an electric cylinder. Each of the sandwiching rollers 292a and 292b is supported by a movable piece 288 so as to be rotatable about an axis extending in the Y-axis direction. A pressing roller 298 is fitted to the upper sandwiching roller 292a via a support shaft 296.

Figure 16:
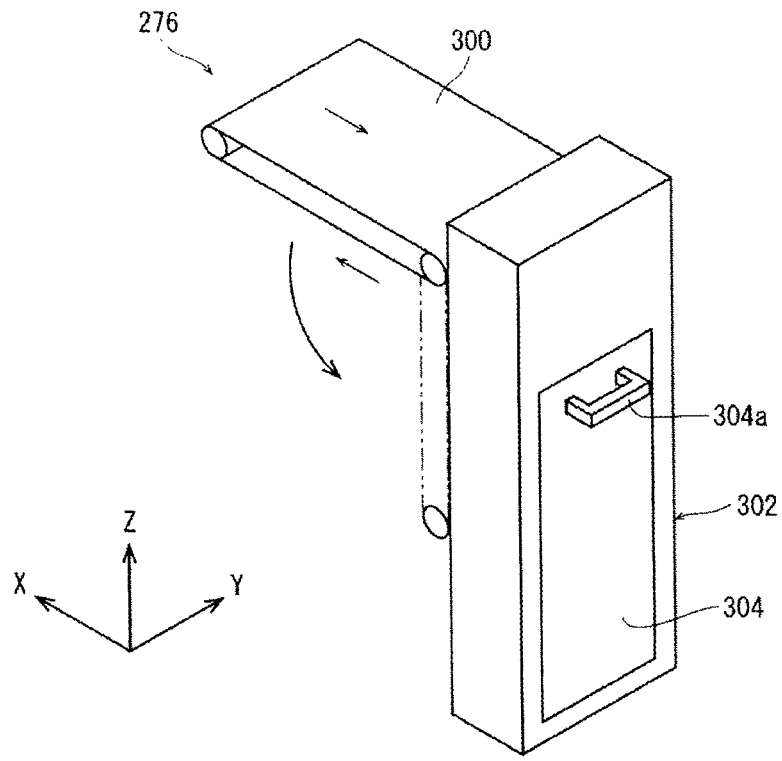
FIG. 16 is a perspective view of a discarding unit of the reinforcing portion removing unit depicted in FIG. 1.

Making description with reference to FIG. 16, the discarding unit 276 includes a belt conveyor 300 that transports the separated ring-shaped reinforcing portion 24 and a dust box 302 that houses the ring-shaped reinforcing portion 24 transported by the belt conveyor 300. The belt conveyor 300 is positioned by an appropriate actuator (not depicted) at a collecting position at which the belt conveyor 300 extends substantially horizontally (position indicated by a solid line in FIG. 16) and a standby position at which the belt conveyor 300 extends substantially vertically (position indicated by a chain double-dashed line in FIG. 16). A door 304 to which a handle 304a is attached is provided to a side surface on a near side in the X-axis direction of the dust box 302 in FIG. 16. A crusher (not depicted) that crushes the collected ring-shaped reinforcing portion 24 is attached to the inside of the dust box 302. The dust box 302 allows crushed waste of the ring-shaped reinforcing portion 24 housed in the dust box 302 to be extracted when the handle 304a is gripped and the door 304 is opened.

Figure 15:
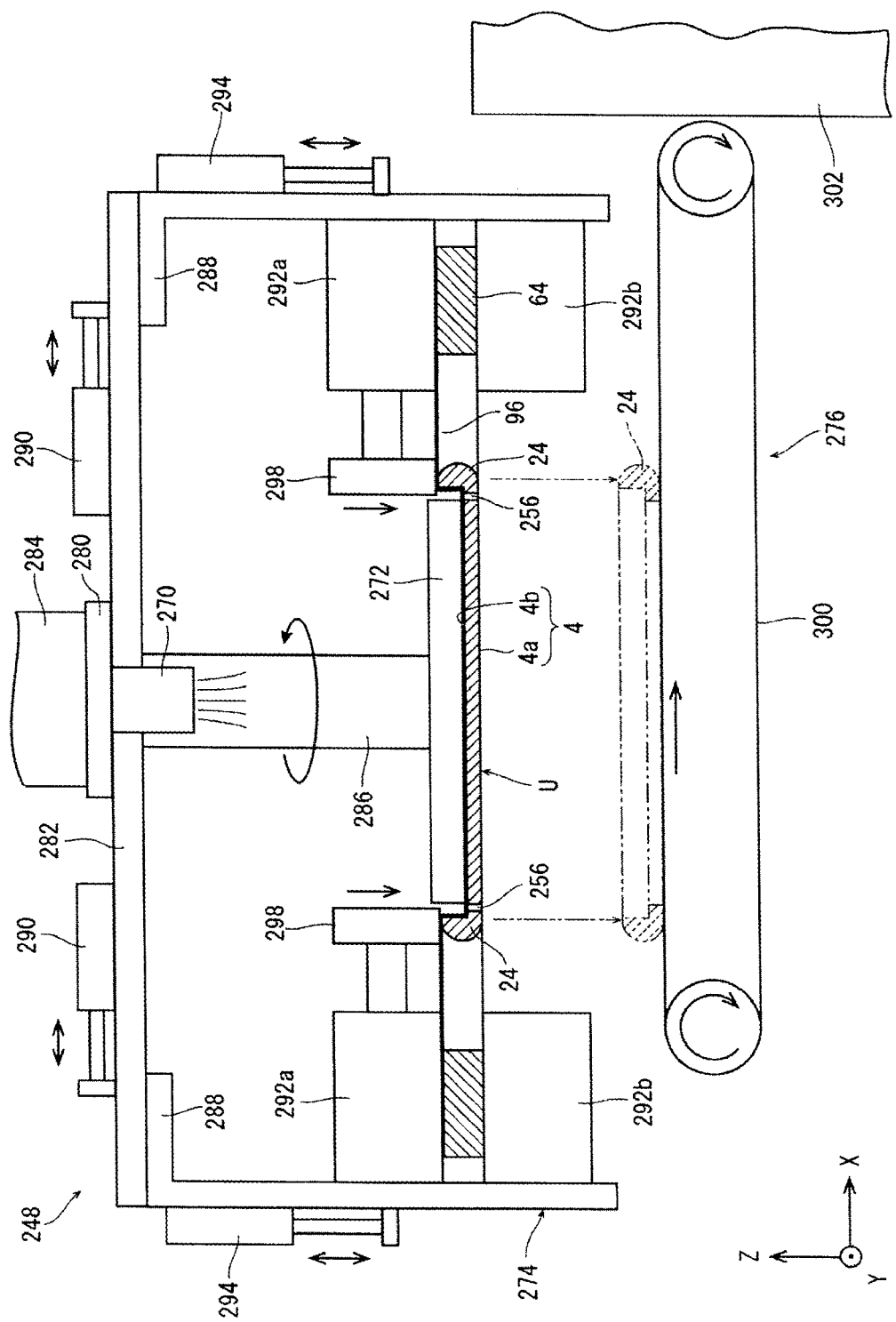
FIG. 15 is a schematic diagram depicting a state in which a reinforcing portion is separated from the wafer in a reinforcing portion removing step.

When the temporary placement table 204 on which the frame unit U having the cutting groove 256 formed at the base of the reinforcing portion 24 is temporarily placed is positioned below the separating unit 248 by the temporary placement table transporting unit 232, as depicted in FIG. 15, the separating unit 248 sucks and holds the undersurface 4b side of the wafer 4 of the frame unit U by the second raising and lowering table 272, and sandwiches the annular frame 64 by the sandwiching rollers 292a and 292b of the separator 274. The separating unit 248 thereafter reduces the adhesive force of the tape 96 affixed to the ring-shaped reinforcing portion 24 by applying ultraviolet rays from the pair of ultraviolet ray irradiating units 270, and separates the ring-shaped reinforcing portion 24 from the frame unit U by rotating the frame unit U by the motor 284 together with the support shaft 286 and the second raising and lowering table 272 with respect to the separator 274 while pressing the ring-shaped reinforcing portion 24 downward by the pressing rollers 298. The belt conveyor 300 transports the separated reinforcing portion 24 to the dust box 302, where the separated reinforcing portion 24 is collected. Incidentally, the separator 274 may be rotated with respect to the frame unit U when the reinforcing portion 24 is separated.

As depicted in FIG. 1, the no-ring unit unloading unit 196 is disposed so as to be adjacent to the reinforcing portion removing unit 194. Making description with reference to FIG. 17 and FIG. 18, the no-ring unit unloading unit 196 in the present embodiment includes an inverting mechanism 308 (see FIG. 17) that includes a frame holding unit 306 that faces the no-ring unit supported by the second raising and lowering table 272 and holds the annular frame 64, and which mechanism moves toward the frame cassette table 200 and inverts the frame holding unit 306, a no-ring unit supporting unit 310 (see FIG. 18) that supports the no-ring unit inverted by the inverting mechanism 308 such that the top surface 4a of the wafer 4 is oriented upward, and a push-in unit 312 (see FIG. 18) that advances and houses the no-ring unit supported by the no-ring unit supporting unit 310 into the frame cassette 198 mounted on the frame cassette table 200.

Figure 17:
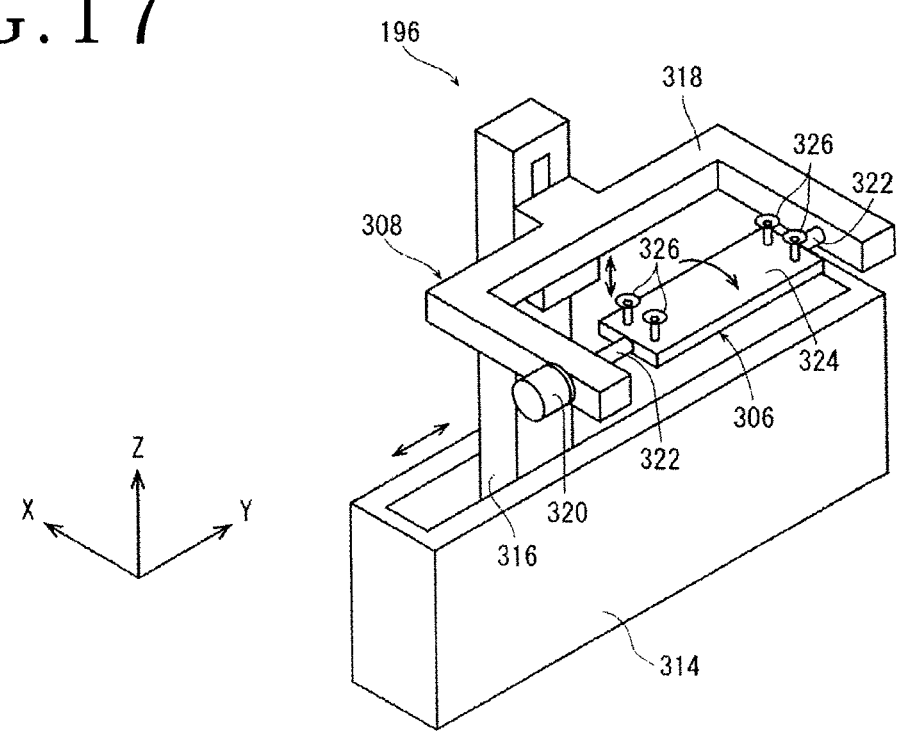
FIG. 17 is a perspective view of an inverting mechanism of a no-ring unit unloading unit depicted in FIG. 1.

As depicted in FIG. 17, the inverting mechanism 308 includes a Y-axis guide member 314 extending in the Y-axis direction, a Y-axis movable member 316 supported by the Y-axis guide member 314 so as to be movable in the Y-axis direction, a Y-axis feed mechanism (not depicted) that moves the Y-axis movable member 316 in the Y-axis direction, an arm 318 supported by the Y-axis movable member 316 so as to be movable in the Z-axis direction, and a Z-axis feed mechanism (not depicted) that moves the arm 318 in the Z-axis direction. It suffices for each of the Y-axis and Z-axis feed mechanisms of the inverting mechanism 308 to have a configuration including a ball screw and a motor that rotates the ball screw.

The above-described frame holding unit 306 is supported by the arm 318 so as to be vertically invertible, and a motor 320 that vertically inverts the frame holding unit 306 is attached to the arm 318. The frame holding unit 306 in the present embodiment includes a board 324 rotatably supported by the arm 318 via a pair of rotary shafts 322 and a plurality of suction pads 326 attached to one surface of the board 324. Each suction pad 326 is connected to suction means (not depicted). In addition, one rotary shaft 322 is coupled to the motor 320.

The inverting mechanism 308 sucks and holds the lower surface of the annular frame 64 of the no-ring unit U' supported by the second raising and lowering table 272 by the suction pads 326 in a state in which the suction pads 326 are oriented upward. The inverting mechanism 308 thus receives the no-ring unit U' from the second raising and lowering table 272. In addition, the inverting mechanism 308 directs the top surface 4a of the wafer 4 upward by inverting the frame holding unit 306 by the motor 320, and thereafter moves the no-ring unit U' held by the frame holding unit 306 toward the frame cassette table 200 by moving the Y-axis movable member 316.

Figure 18:
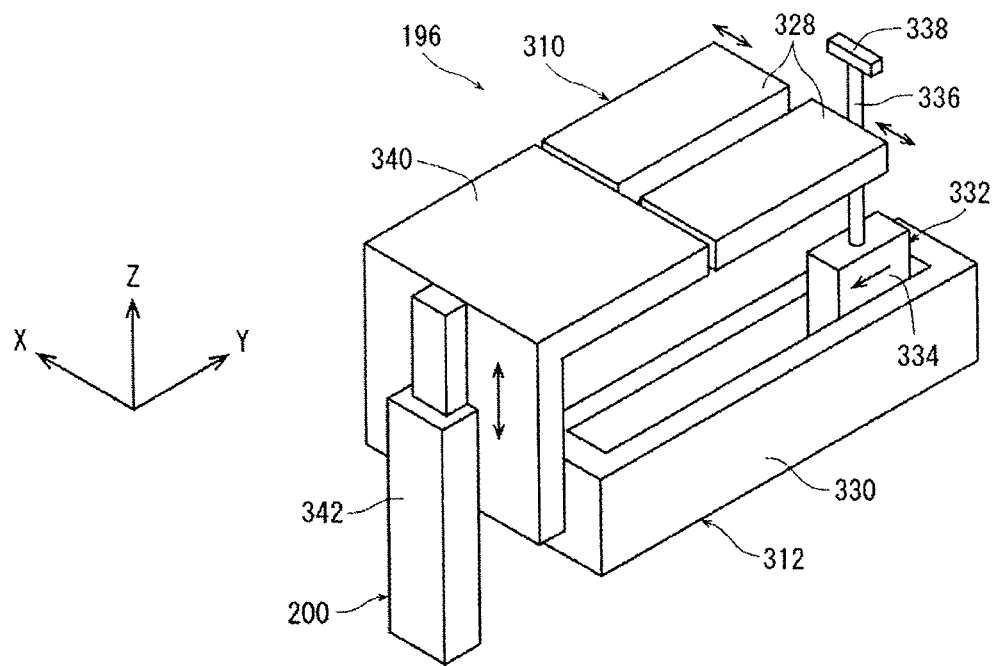
FIG. 18 is a perspective view of a no-ring unit supporting unit and a push-in unit of the no-ring unit unloading unit depicted in FIG. 1.

As depicted in FIG. 18, the no-ring unit supporting unit 310 in the present embodiment includes a pair of support plates 328 supported so as to be movable in the X-axis direction via appropriate brackets (not depicted) and distance adjusting means (not depicted) for adjusting a distance in the X-axis direction between the pair of support plates 328. The distance adjusting means can be formed by an appropriate actuator such as an air cylinder, or an electric cylinder.

The pair of support plates 328 supporting the no-ring unit U' is fitted with a heater (not depicted). In a state in which the distance between the pair of support plates 328 is narrowed, the pair of support plates 328 heats the tape 96 of the no-ring unit U' by the heater, and thereby removes a slack or a wrinkle in the tape 96 which slack or wrinkle is caused by removing the reinforcing portion 24.

Continuing the description with reference to FIG. 18, the push-in unit 312 in the present embodiment includes a Y-axis guide member 330 extending in the Y-axis direction, a Y-axis movable member 332 supported by the Y-axis guide member 330 so as to be movable in the Y-axis direction, and a Y-axis feed mechanism (not depicted) that moves the Y-axis movable member 332 in the Y-axis direction. The Y-axis movable member 332 includes a base portion 334 supported by the Y-axis guide member 330, a column 336 extending upward from the upper surface of the base portion 334, and a pressing piece 338 attached to an upper end of the column 336. It suffices for the Y-axis feed mechanism of the push-in unit 312 to have a configuration including a ball screw coupled to the Y-axis movable member 332 and extending in the Y-axis direction and a motor that rotates the ball screw.

Figure 19:
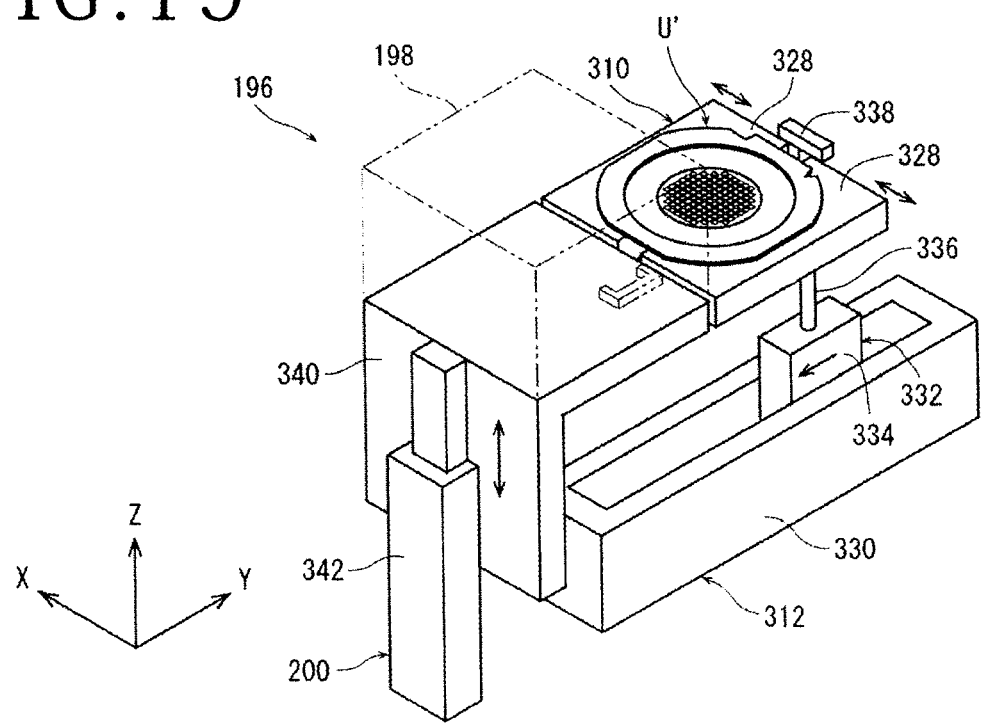
FIG. 19 is a perspective view depicting a state in which a no-ring unit housing step is performed.

As depicted in FIG. 19, the no-ring unit supporting unit 310 increases the distance between the pair of support plates 328 by the distance adjusting means before receiving the no-ring unit U', and thereafter receives the no-ring unit U' held by the suction pads 326. Then, the push-in unit 312 moves the Y-axis movable member 332 in the Y-axis direction by the Y-axis feed mechanism, and thereby advances and houses the no-ring unit U' supported by the no-ring unit supporting unit 310 into the frame cassette 198 mounted on the frame cassette table 200 by the pressing piece 338.

The frame cassette 198 depicted in FIG. 1 and FIG. 19 houses a plurality of no-ring units U' at intervals in the upward-downward direction in a state in which the top surfaces 4a of the wafers 4 are oriented upward. As depicted in FIG. 18 and FIG. 19, the frame cassette table 200 includes a mounting unit 340 on which the frame cassette 198 is mounted and a raising and lowering unit 342 that positions the mounting unit 340 at an optional height by raising or lowering the mounting unit 340. It suffices for the raising and lowering unit 342 to have a configuration including a ball screw coupled to the mounting unit 340 and extending in the Z-axis direction and a motor that rotates the ball screw.

Description will next be made of a processing method in which the processing apparatus 2 as described above is used to integrate the wafer 4 with the annular frame 64 by affixing the dicing tape 96 to the undersurface 4b of the wafer 4 having the ring-shaped reinforcing portion 24 formed in a projecting shape on a part of the undersurface 4b which part corresponds to the peripheral, and remove the ring-shaped reinforcing portion 24 from the wafer 4 by cutting the ring-shaped reinforcing portion 24.

In the present embodiment, first, as depicted in FIG. 1 and FIG. 3, a wafer cassette mounting step is performed which mounts the wafer cassette 6 housing a plurality of wafers 4 on the wafer cassette table 8. The cassette 6 houses the plurality of wafers 4 at intervals in the upward-downward direction in a state in which the top surfaces 4a are oriented upward.

In addition, as depicted in FIG. 1 and FIG. 5, a frame housing step is performed which houses a plurality of ring-shaped annular frames 64 in which an opening portion 64a for housing a wafer 4 is formed into the frame housing unit 66. The frame housing step may be performed before the wafer cassette mounting step, or may be performed after the wafer cassette mounting step.

In the frame housing step, the raising and lowering plate 74 of the frame housing unit 66 is lowered to an optional position, thereafter the door 76 is opened while the handle 76a is gripped, and the plurality of annular frames 64 are housed in a stacked manner on the upper surface of the raising and lowering plate 74. In addition, an annular frame 64 at a top is positioned in such a position as to be unloadable by the frame unloading unit 68 by adjusting the height of the raising and lowering plate 74 as appropriate.

After the wafer cassette mounting step and the frame housing step are performed, a wafer unloading step is performed which unloads a wafer 4 from the wafer cassette 6 mounted on the wafer cassette table 8.

Making description with reference to FIG. 3, in the wafer unloading step, first, the Y-axis movable member 32 is positioned in the vicinity of the wafer cassette table 8 by actuating the Y-axis feed mechanism 34 of the wafer unloading unit 10. Next, the hand 44 having the air jetting ports 46 oriented upward is positioned on the undersurface 4b side (lower side) of the wafer 4 within the wafer cassette 6 by driving the transporting arm 42. When the hand 44 is positioned on the undersurface 4b side of the wafer 4, a gap is provided between the undersurface 4b of the wafer 4 and the hand 44, and each guide pin 48 is positioned outward in the radial direction.

Next, a negative pressure is generated on one surface side of the hand 44 on the basis of a Bernoulli effect by jetting a compressed air from the air jetting ports 46 of the hand 44, and the wafer 4 is thus sucked and supported by the hand 44 from the undersurface 4b side in a noncontact manner. Next, each guide pin 48 is moved inward in the radial direction, and thereby horizontal movement of the wafer 4 sucked and supported by the hand 44 is regulated by each guide pin 48. Then, the wafer 4 sucked and supported by the hand 44 is unloaded from the wafer cassette 6 by moving the Y-axis movable member 32 and the transporting arm 42 of the wafer unloading unit 10.

After the wafer unloading step is performed, a notch detecting step is preferably performed which detects the position of the notch 26 of the wafer 4. In the notch detecting step, as depicted in FIG. 4, the outer circumference of the wafer 4 sucked and supported by the hand 44 is positioned between the light emitting element 52 and the light receiving element 54 of the notch detecting mechanism 50. Next, the position of the notch 26 of the wafer 4 is detected by rotating the wafer 4 by the driving source via the guide pin 48. Thus, the orientation of the wafer 4 can be adjusted to an optional orientation.

After the notch detecting step is performed, a wafer supporting step is performed which supports, by the wafer table 12, the top surface 4a side of the wafer 4 unloaded by the wafer unloading unit 10.

Making description with reference to FIG. 3, in the wafer supporting step, first, the top surface 4a of the wafer 4 is oriented downward by vertically inverting the hand 44 of the wafer unloading unit 10. Next, the peripheral surplus region 20 of the top surface 4a of the wafer 4 sucked and supported by the hand 44 is brought into contact with the annular supporting portion 56 of the wafer table 12 by moving the Y-axis movable member 32 and the transporting arm 42 of the wafer unloading unit 10. At this time, the device region 18 of the top surface 4a of the wafer 4 is located on the recess 62 of the wafer table 12. Thus, the devices 14 and the wafer table 12 do not come into contact with each other, so that damage to the devices 14 is prevented.

Next, a suction force is generated in each suction hole 60 by actuating the suction means of the wafer table 12, and the peripheral surplus region 20 of the top surface 4a of the wafer 4 is thereby sucked and held. Next, the suction and support of the wafer 4 by the hand 44 is released, and the hand 44 is separated from the wafer table 12. The wafer 4 is thus transferred from the wafer unloading unit 10 to the wafer table 12. Because the wafer 4 transferred to the wafer table 12 is sucked and held by each suction hole 60, the position of the wafer 4 is not shifted.

In addition, after the wafer cassette mounting step and the frame housing step are performed, a frame unloading step is performed which unloads an annular frame 64 from the frame housing unit 66 in parallel with the wafer unloading step and the wafer supporting step.

Making description with reference to FIG. 5, in the frame unloading step, first, the suction pads 92 of the holding unit 88 are brought into contact with the upper surface of an annular frame 64 at the top which annular frame is housed in the frame housing unit 66 by moving the X-axis movable member 84 and the Z-axis movable member 86 of the frame unloading unit 68. Next, a suction force is generated in the suction pads 92 by actuating the suction means of the frame unloading unit 68, and the annular frame 64 at the top is thereby sucked and held by the suction pads 92. Then, the annular frame 64 at the top which annular frame is sucked and held by the suction pads 92 of the holding unit 88 is unloaded from the frame housing unit 66 by moving the X-axis movable member 84 and the Z-axis movable member 86 of the frame unloading unit 68.

After the frame unloading step is performed, a frame supporting step is performed which supports the annular frame 64 unloaded by the frame unloading unit 68 by the frame table 70. Continuing the description with reference to FIG. 5, in the frame supporting step, first, the annular frame 64 sucked and held by the suction pads 92 is brought into contact with the upper surface of the frame table 70 by moving the X-axis movable member 84 and the Z-axis movable member 86 of the frame unloading unit 68. At this time, the frame table 70 is positioned at the lowered position (position indicated by a solid line in FIG. 5). Next, the annular frame 64 is mounted onto the frame table 70 by releasing the suction force of the suction pads 92 of the frame unloading unit 68. Then, the holding unit 88 is separated from above the frame table 70 by moving the X-axis movable member 84 and the Z-axis movable member 86 of the frame unloading unit 68.

After the frame supporting step is performed, a tape affixing step is performed which affixes the tape 96 to the annular frame 64. Making description with reference to FIG. 6, in the tape affixing step, first, before the frame table 70 is moved from the lowered position (position depicted in FIG. 6A) to the raised position (position depicted in FIG. 6B) at which the tape 96 can be affixed to the annular frame 64, the tape 96 is extracted from the roll tape 96R, and the tape 96 from which the peeling paper 116 is peeled is positioned above the frame table 70. Incidentally, the adhesive surface of the tape 96 located above the frame table 70 is oriented downward.

Next, the frame table 70 is raised to such a degree that the pressing roller 132 of the compression bonding unit 110 of the tape affixing unit 98 can press the tape 96 against the annular frame 64 from above. Then, the pressing roller 132 is rolled in the Y-axis direction while the pressing roller 132 presses the adhesive surface of the tape 96 against the annular frame 64. The tape 96 extracted from the roll tape 96R by the tape extracting unit 108 can be thereby compression-bonded to the annular frame 64.

Next, the cutter 144 and the pressing roller 146 of the cutting unit 112 of the tape affixing unit 98 are lowered, the cutter 144 is pressed against the tape 96 on the annular frame 64, and the annular frame 64 is pressed by the pressing roller 146 from above the tape 96. Next, the cutter 144 and the pressing roller 146 are moved so as to describe a circle along the annular frame 64 by rotating the arm piece 140 by the motor 138. The tape 96 extending off the outer circumference of the annular frame 64 can be thereby cut along the annular frame 64. In addition, because the pressing roller 146 presses the annular frame 64 from above the tape 96, positional displacement of the annular frame 64 and the tape 96 is prevented while the tape 96 is cut. Incidentally, the already used tape 96 in which a circular opening portion 120 is formed is wound by the tape winding unit 106.

After the tape affixing step is performed, a tape-affixed frame transporting step is performed which transports the annular frame 64 to which the tape 96 is affixed to the wafer table 12, positions the opening portion 64a of the annular frame 64 at the undersurface 4b of the wafer 4 supported by the wafer table 12, and mounts the tape-affixed frame 64' on the wafer table 12.

In the tape-affixed frame transporting step, first, the frame table 70 is moved from the raised position to the lowered position. Next, the Y-axis movable member 150 and the Z-axis movable member 152 of the tape-affixed frame transporting unit 100 (see FIG. 5) are moved to bring each suction pad 158 of the holding unit 154 of the tape-affixed frame transporting unit 100 into contact with the upper surface of the tape-affixed frame 64' (see FIG. 7) supported by the frame table 70 in a state in which the adhesive surface of the tape 96 is oriented downward.

Next, a suction force is generated in the suction pads 158 by actuating the suction means of the tape-affixed frame transporting unit 100, and thereby the upper surface of the tape-affixed frame 64' is sucked and held by the suction pads 158. Next, the tape-affixed frame 64' sucked and held by the suction pads 158 is unloaded from the frame table 70 by moving the Y-axis movable member 150 and the Z-axis movable member 152 of the tape-affixed frame transporting unit 100.

Next, the tape-affixed frame 64' sucked and held by the suction pads 158 of the tape-affixed frame transporting unit 100 is transported to the wafer table 12. As depicted in FIG. 7, the opening portion 64a of the frame 64 is positioned at the undersurface 4b of the wafer 4 supported by the wafer table 12, and the tape-affixed frame 64' is brought into contact with the frame supporting portion 58 of the wafer table 12. At this time, the adhesive surface of the tape 96 of the tape-affixed frame 64' is oriented downward, and the undersurface 4b of the wafer 4 is oriented upward and faces the adhesive surface of the tape 96.

Next, the suction force of the suction pads 158 of the tape-affixed frame transporting unit 100 is released, and thereby the tape-affixed frame 64' is mounted on the frame supporting portion 58 of the wafer table 12. Then, the holding unit 154 is separated from above the wafer table 12 by moving the Y-axis movable member 150 and the Z-axis movable member 152 of the tape-affixed frame transporting unit 100.

After the tape-affixed frame transporting step is performed, a tape compression-bonding step is performed which compression-bonds the tape 96 of the tape-affixed frame 64' to the undersurface 4b of the wafer 4. Making description with reference to FIGS. 7 to 9, in the tape compression-bonding step, first, the raising and lowering mechanism 164 of the tape compression-bonding unit 102 lowers the upper chamber 160, and brings the lower end of the side wall 172 of the upper chamber 160 into contact with the upper end of the side wall 186 of the lower chamber 162. Consequently, the upper chamber 160 and the lower chamber 162 are set in the closed state, and the pressing roller 174 is brought into contact with the tape-affixed frame 64'. Then, as depicted in FIG. 8, an upper end of the ring-shaped reinforcing portion 24 of the wafer 4 adheres to the adhesive surface of the tape 96 of the tape-affixed frame 64'.

Next, the inside of the upper chamber 160 and the lower chamber 162 is evacuated by actuating the vacuum unit 166 in a state in which the atmosphere opening unit 168 of the tape compression-bonding unit 102 is closed. Next, as depicted in FIG. 8 and FIG. 9, the tape 96 is compression-bonded to the undersurface 4b of the wafer 4 by rolling the pressing roller 174 of the tape compression-bonding unit 102 in the Y-axis direction. A frame unit U in which the undersurface 4b of the wafer 4 and the tape 96 are compression-bonded to each other can be thereby produced. Next, the atmosphere opening unit 168 is opened, and the atmospheric pressure makes the tape 96 closely adheres to the undersurface 4b of the wafer 4 along the base of the ring-shaped reinforcing portion 24. Then, the raising and lowering mechanism 164 raises the upper chamber 160. Incidentally, the suction force applied to the wafer 4 by the wafer table 12 is lost by evacuating the inside of the upper chamber 160 and the lower chamber 162. However, the position of the wafer 4 is not shifted in the tape compression-bonding step because the upper end of the ring-shaped reinforcing portion 24 of the wafer 4 adheres to the adhesive surface of the tape 96 of the tape-affixed frame 64' when the upper chamber 160 and the lower chamber 162 are set in the closed state.

After the tape compression-bonding step is performed, a frame unit unloading step is performed which unloads the frame unit U in which the tape 96 of the tape-affixed frame 64' and the undersurface 4b of the wafer 4 are compression-bonded to each other from the wafer table 12. Making description with reference to FIG. 5, in the frame unit unloading step, first, the transporting unit 206 of the frame unit unloading unit 192 is actuated to bring the lower surface of the suction piece 210 of the wafer holding unit 202a of the frame unit holding unit 202 into contact with the tape 96 on the undersurface 4b side of the wafer 4, and bring the suction pads 214 of the frame holding unit 202b into contact with the annular frame 64.

Next, a suction force is generated in the suction piece 210 of the wafer holding unit 202a and the suction pads 214 of the frame holding unit 202b. Consequently, in a state in which the whole or a part of the periphery of the wafer 4 is exposed, the suction piece 210 of the wafer holding unit 202a sucks and holds the wafer 4 from the undersurface 4b side (tape 96 side), and the suction pads 214 of the frame holding unit 202b suck and hold the annular frame 64. Next, the suction and holding of the wafer 4 by the wafer table 12 is released. Then, the frame unit U held by the frame unit holding unit 202 is unloaded from the wafer table 12 by actuating the transporting unit 206.

After the frame unit unloading step is performed, a temporary placing step is performed which makes the center of the wafer 4 coincides with the center of the temporary placement table 204, and temporarily places the frame unit U on the temporary placement table 204.

Making description with reference to FIG. 10, in the temporary placing step, first, the frame unit U held by the frame unit holding unit 202 is positioned above the imaging unit 224. Next, the transporting unit 206 of the frame unit unloading unit 192 is actuated, and the imaging unit 224 images at least three positions of the exposed part of the periphery of the wafer 4 of the frame unit U held by the frame unit holding unit 202. When the imaging unit 224 images the wafer 4 from below, the illuminating unit 400 illuminates the wafer 4 from above the wafer 4. The coordinates of at least three point of the periphery of the wafer 4 are thereby measured. Next, the central coordinates of the wafer 4 are obtained on the basis of the measured coordinates of the three points. Because the whole or a part of the periphery of the wafer 4 sucked and held by the suction piece 210 of the wafer holding unit 202a is exposed, the contour of the wafer 4 can be imaged clearly by illuminating the exposed part of the periphery of the wafer 4 from above by the illuminating unit 400, and imaging the exposed part of the periphery of the wafer 4 from below by the imaging unit 224. Thus, the central coordinates of the wafer 4 can be obtained precisely.

Next, the transporting unit 206 is actuated to position the center of the wafer 4 at the center of the annular supporting portion 226 of the temporary placement table 204, bring the peripheral surplus region 20 of the top surface 4a of the wafer 4 into contact with the upper surface of the annular supporting portion 226 of the temporary placement table 204, and bring the lower surface of the annular frame 64 into contact with the upper surface of the frame supporting portion 228 of the temporary placement table 204. The annular frame 64 is held by the magnetic force of the strong permanent magnets 402. At this time, each of the strong permanent magnets 402 and the annular supporting portion 226 is positioned at the raised position. Next, a suction force is generated in each suction hole 229 by actuating the suction means of the temporary placement table 204. The peripheral surplus region 20 of the top surface 4a of the wafer 4 is thereby sucked and held. In addition, at this time, though the top surface 4a of the wafer 4 is oriented downward, the device region 18 is located on the recess 230 of the temporary placement table 204. Thus, the devices 14 and the temporary placement table 204 do not come into contact with each other, so that damage to the devices 14 is prevented.

Next, the suction and holding of the wafer 4 by the wafer holding unit 202a is released, and the suction and holding of the annular frame 64 by the frame holding unit 202b is released. The frame unit U is thereby transferred from the frame unit unloading unit 192 to the temporary placement table 204. Next, the heater of the frame supporting portion 228 is actuated, and the heater heats the tape 96 of the frame unit U temporarily placed on the temporary placement table 204. Consequently, the tape 96 is softened, and the tape 96 is made to closely adhere to the base of the ring-shaped reinforcing portion 24 of the wafer 4.

After the temporary placing step is performed, a reinforcing portion removing step is performed which cuts and removes the ring-shaped reinforcing portion 24 from the wafer 4 of the frame unit U unloaded by the frame unit unloading unit 192.

Making description with reference to FIG. 1, FIG. 10, and FIGS. 13A and 13B, in the reinforcing portion removing step, first, the lower surfaces of the permanent magnets 424 of the holding member 420 of the first raising and lowering table 246 are brought into contact with the upper surface of the annular frame 64 of the frame unit U temporarily placed on the temporary placement table 204 by moving the X-axis movable member 260 and the Z-axis movable member 262 of the first raising and lowering table 246 of the reinforcing portion removing unit 194, and the annular frame 64 is held by the magnetic force of the permanent magnets 424. In addition, the lower surface of the suction chuck 430 is brought into contact with the undersurface 4b side (tape 96 side) of the wafer 4, and the wafer 4 is held by the suction force of the suction chuck 430. Next, the first raising and lowering table 246 sucking and holding the frame unit U is raised after the strong permanent magnets 402 of the temporary placement table 204 are positioned at the lowered position and the suction force of the annular supporting portion 226 is released. As described above, the magnetic force of the permanent magnets 424 of the holding member 420 is weaker than the magnetic force of the strong permanent magnets 402 of the temporary placement table 204. When the strong permanent magnets 402 are positioned at the lowered position, the strong permanent magnets 402 are separated from the annular frame 64. Thus, the magnetic force of the strong permanent magnets 402 acting on the annular frame 64 is weakened. The frame unit U can therefore be detached from the temporary placement table 204 easily.

Next, the X-axis movable member 260 and the Z-axis movable member 262 of the first raising and lowering table 246 are actuated, and as depicted in FIG. 12, the frame unit U held by the holding member 420 of the first raising and lowering table 246 is positioned above the laser beam irradiating unit 244. Next, a condensing point of the laser beam LB is positioned at the base of the ring-shaped reinforcing portion 24 of the wafer 4 of the frame unit U.

Next, the base of the ring-shaped reinforcing portion 24 of the wafer 4 is irradiated with the laser beam LB while the motor 266 of the first raising and lowering table 246 rotates the holding member 420 and the frame unit U. Consequently, a ring-shaped cutting groove 256 can be formed by performing the ablation processing on the base of the ring-shaped reinforcing portion 24 of the wafer 4. Leakage light of the laser beam LB passing through the wafer 4 and the tape 96 is diffused in the space 428 between the wafer holding unit 422 and the frame supporting portion 426. An adverse effect of the leakage light on the devices 14 of the wafer 4 is therefore reduced. In addition, when the wafer 4 is irradiated with the laser beam LB, a suction force is generated in the suction nozzle 254 by actuating the suction means of the laser beam irradiating unit 244, and the suction nozzle 254 sucks debris produced by the ablation processing.

Next, the lower surface of the annular frame 64 of the frame unit U held by the holding member 420 is brought into contact with the upper surface of the frame supporting portion 228 of the temporary placement table 204 by moving the X-axis movable member 260 and the Z-axis movable member 262 of the first raising and lowering table 246. The annular frame 64 is thereby held by the magnetic force of the strong permanent magnets 402 positioned at the raised position. At this time, in order to prevent the debris adhering to the periphery of the wafer 4 from adhering to the suction holes 229, it is preferable not to generate a suction force in the suction holes 229 of the annular supporting portion 226, and it is preferable to position the annular supporting portion 226 at the lowered position in advance. Next, the suction force of the suction chuck 430 of the first raising and lowering table 246 is released, and thereafter the holding member 420 is raised. As described above, the magnetic force of the permanent magnets 424 of the holding member 420 is weaker than the magnetic force of the strong permanent magnets 402 of the temporary placement table 204. The annular frame 64 is therefore transferred from the permanent magnets 424 to the strong permanent magnets 402. Then, when the holding member 420 is raised, the frame unit U is held on the temporary placement table 204, and is separated from the holding member 420 of the first raising and lowering table 246. The frame unit U is thus transferred from the first raising and lowering table 246 to the temporary placement table 204.

Next, the temporary placement table transporting unit 232 positions the temporary placement table 204 receiving the frame unit U below the separating unit 248 of the reinforcing portion removing unit 194 (see FIG. 10). Incidentally, at this time, the belt conveyor 300 of the discarding unit 276 is positioned at the standby position in advance. Next, the second raising and lowering table 272 of the separating unit 248 is lowered, and thereby the lower surface of the second raising and lowering table 272 is brought into contact with the tape 96 on the undersurface 4b part of the wafer 4. Next, a suction force is generated in the lower surface of the second raising and lowering table 272, and thereby the second raising and lowering table 272 sucks and holds the undersurface 4b side of the wafer 4 of the frame unit U.

Next, after the strong permanent magnets 402 of the temporary placement table 204 are positioned at the lowered position, the second raising and lowering table 272 sucking and holding the wafer 4 of the frame unit U is raised. Next, the temporary placement table 204 is moved to a position below the first raising and lowering table 246. Thereafter, as depicted in FIG. 15, the pair of feed means 290 and the Z-axis feed mechanisms 294 of the separator 274 are actuated, and thereby the upper and lower sandwiching rollers 292a and 292b sandwich the annular frame 64 in the upward-downward direction. In addition, the belt conveyor 300 of the discarding unit 276 is positioned from the standby position to the collecting position.

Next, the adhesive force of the tape 96 adhering to the ring-shaped reinforcing portion 24 is reduced by applying ultraviolet rays from the pair of ultraviolet ray irradiating units 270, and the motor 284 rotates the frame unit U together with the support shaft 286 and the second raising and lowering table 272 with respect to the separator 274 while the pressing rollers 298 press the ring-shaped reinforcing portion 24 downward. The ring-shaped reinforcing portion 24 can be thereby separated from the frame unit U. The belt conveyor 300 transports the reinforcing portion 24 dropped from the frame unit U to the dust box 302, where the reinforcing portion 24 is collected. Incidentally, the separator 274 may be rotated with respect to the frame unit U when the reinforcing portion 24 is separated.

After the reinforcing portion removing step is performed, a no-ring unit unloading step is performed which unloads the no-ring unit U' from which the ring-shaped reinforcing portion 24 is removed from the reinforcing portion removing unit 194. In the no-ring unit unloading step, first, the belt conveyor 300 of the discarding unit 276 of the reinforcing portion removing unit 194 is positioned from the collecting position to the standby position. Next, the frame holding unit 306 of the inverting mechanism 308 (see FIG. 17) of the no-ring unit unloading unit 196 is positioned below the no-ring unit U' sucked and held by the second raising and lowering table 272.

Next, the arm 318 is raised in a state in which the suction pads 326 of the frame holding unit 306 are oriented upward, and thereby the suction pads 326 of the frame holding unit 306 are brought into contact with the lower surface side of the annular frame 64 of the no-ring unit U' that is supported by the second raising and lowering table 272 and in which the top surface 4a of the wafer 4 is oriented downward.

Next, a suction force is generated in the suction pads 326 of the frame holding unit 306, and the suction pads 326 thereby suck and hold the annular frame 64 of the no-ring unit U'. Next, the suction and holding of the no-ring unit U' by the second raising and lowering table 272 is released. The no-ring unit U' is thereby transferred from the second raising and lowering table 272 of the reinforcing portion removing unit 194 to the frame holding unit 306 of the no-ring unit unloading unit 196.

After the no-ring unit unloading step is performed, a no-ring unit housing step is performed which houses the no-ring unit U' unloaded by the no-ring unit unloading unit 196. In the no-ring unit housing step, first, the no-ring unit U' sucked and held by the frame holding unit 306 is vertically inverted by vertical inversion of the inverting mechanism 308 of the no-ring unit unloading unit 196. Consequently, the no-ring unit U' is positioned below the frame holding unit 306, and the top surface 4a of the wafer 4 is oriented upward.

Next, the no-ring unit U' is brought into contact with the upper surfaces of the pair of support plates 328 of the no-ring unit supporting unit 310 by moving the Y-axis movable member 316 and the arm 318 of the inverting mechanism 308. At this time, the distance between the pair of support plates 328 is decreased by the distance adjusting means, and the pair of support plates 328 is in close contact with each other. Next, the suction and holding of the no-ring unit U' by the frame holding unit 306 is released, and thereby the no-ring unit U' is mounted on the pair of support plates 328. Next, the tape 96 of the no-ring unit U' is heated by actuating the heater fitted to each of the support plates 328. A warp or a wrinkle in the tape 96 which warp or wrinkle is caused by removing the reinforcing portion 24 is thereby removed. Then, the frame holding unit 306 sucks and holds the no-ring unit U' again and raises the no-ring unit U'.

Next, after the distance adjusting means increases the distance between the pair of support plates 328, the no-ring unit U' is mounted on the upper surfaces of the support plates 328. Then, as depicted in FIG. 19, the pressing piece 338 of the push-in unit 312 pushes the no-ring unit U' supported by the no-ring unit supporting unit 310, and thereby advances and houses the no-ring unit U' into the frame cassette 198 placed on the frame cassette table 200.

As described above, the processing apparatus 2 in the present embodiment facilitates work of integrating the wafer 4 with the annular frame 64 by affixing the dicing tape 96 to the undersurface 4b of the wafer 4 having the ring-shaped reinforcing portion 24 formed in a projecting shape on the part of the undersurface 4b which part corresponds to the peripheral, and facilitates removal of the ring-shaped reinforcing portion 24 from the wafer 4 by cutting the ring-shaped reinforcing portion 24. Excellent productivity is thus achieved.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing apparatus for removing a ring-shaped reinforcing portion in a projecting shape from a wafer having the reinforcing portion formed in the projecting shape on an undersurface part corresponding to a peripheral surplus region, the processing apparatus comprising:
   a wafer cassette table mounted with a wafer cassette housing a plurality of wafers;
   a wafer unloading unit configured to unload the wafer from the wafer cassette mounted on the wafer cassette table;
   a wafer table configured to support a top surface side of the wafer unloaded by the wafer unloading unit;
   a frame housing unit configured to house a plurality of annular frames in which an opening portion for housing the wafer is formed;
   a frame unloading unit configured to unload an annular frame from the frame housing unit;
   a frame table configured to support the annular frame unloaded by the frame unloading unit;
   a tape affixing unit disposed above the frame table and configured to affix a tape to the annular frame;
   a tape-affixed frame transporting unit configured to transport the annular frame to which the tape is affixed to the wafer table, position the opening portion of the annular frame at the undersurface of the wafer supported by the wafer table, and mount the tape-affixed frame on the wafer table;
   a tape compression-bonding unit configured to compression-bond the tape of the tape-affixed frame to the undersurface of the wafer;
   a frame unit unloading unit configured to unload, from the wafer table, a frame unit in which the tape of the tape-affixed frame and the undersurface of the wafer are compression-bonded to each other by the tape compression-bonding unit;
   a reinforcing portion removing unit configured to cut and remove the ring-shaped reinforcing portion from the wafer of the frame unit unloaded by the frame unit unloading unit;
   a no-ring unit unloading unit configured to unload the no-ring unit from which the ring-shaped reinforcing portion is removed from the reinforcing portion removing unit; and
   a frame cassette table mounted with a frame cassette configured to house the no-ring unit unloaded by the no-ring unit unloading unit, wherein
   the frame unit unloading unit includes
      a frame unit holding unit including a wafer holding portion configured to hold the wafer while exposing a whole or a part of a periphery of the wafer and a frame holding portion configured to hold the annular frame,
      a transporting unit configured to transport the frame unit holding unit to a temporary placement table,
      an imaging unit configured to image the periphery of the wafer of the frame unit held by the frame unit holding unit, and
      an illuminating unit facing the imaging unit and disposed at a position at which the wafer is interposed between the illuminating unit and the imaging unit, and wherein
   the frame unit unloading unit actuates the transporting unit and images at least three positions of the periphery of the wafer by the imaging unit, obtains central coordinates of the wafer, and makes a center of the wafer coincide with a center of the temporary placement table.

2. The processing apparatus according to claim 1, wherein the wafer unloading unit includes a transporting arm and a hand disposed at a distal end of the transporting arm and configured to support the undersurface of the wafer housed in the wafer cassette and invert a top side and an underside of the wafer.

3. The processing apparatus according to claim 2, wherein the hand is a Bernoulli pad configured to generate a negative pressure by jetting air and support the wafer in a noncontact manner.

4. The processing apparatus according to claim 1, wherein the wafer table includes an annular supporting portion configured to support the peripheral surplus region of the wafer and leave a part on an inside of the peripheral surplus region in a noncontact state and a frame supporting portion disposed on a periphery of the annular supporting portion and configured to support the annular frame.

5. The processing apparatus according to claim 1, wherein the tape affixing unit includes a roll tape supporting portion configured to support a roll tape wound with the tape before usage, a tape winding portion configured to wind the tape already used, a tape extracting portion configured to extract the tape from the roll tape, a compression bonding portion configured to compression-bond the extracted tape to the annular frame, and a cutting portion configured to cut the tape extending off an outer circumference of the annular frame along the annular frame.

6. The processing apparatus according to claim 1, wherein the tape compression-bonding unit includes an upper chamber disposed above the wafer table, a lower chamber configured to house the wafer table, a raising and lowering mechanism configured to produce a closed state in which the upper chamber is lowered and set in contact with the lower chamber and an opened state in which the upper chamber is separated from the lower chamber, a vacuum portion configured to evacuate the upper chamber and the lower chamber in the closed state, and an atmosphere opening portion configured to open the upper chamber and the lower chamber to an atmosphere, and, in a state in which the tape of the tape-affixed frame is positioned at the undersurface of the wafer supported by the wafer table, the upper chamber and the lower chamber are evacuated while the closed state is maintained by actuating the raising and lowering mechanism, and a pressing roller disposed in the upper chamber compression-bonds the tape of the tape-affixed frame to the undersurface of the wafer.

7. The processing apparatus according to claim 1, wherein the reinforcing portion removing unit includes a laser beam irradiating unit configured to form a cutting groove by applying a laser beam to a base of the ring-shaped reinforcing portion formed on the periphery of the wafer, a first raising and lowering table configured to hold and raise the frame unit temporarily placed on the temporary placement table, and position the frame unit at the laser beam irradiating unit, and a separating portion configured to separate the ring-shaped reinforcing portion from the cutting groove, the first raising and lowering table includes a small-diameter wafer holding portion smaller than an outside diameter of the wafer and configured to expose the ring-shaped reinforcing portion, a frame supporting portion having a permanent magnet configured to magnetically hold the annular frame, and a space configured to diffuse leakage light of the laser beam between the wafer holding portion and the frame supporting portion, the separating unit includes an ultraviolet ray irradiating portion configured to reduce an adhesive force of the tape by irradiating a tape corresponding to the cutting groove with an ultraviolet ray, a second raising and lowering table configured to suck and hold an inside of the wafer while exposing the ring-shaped reinforcing portion to a periphery of the second raising and lowering table, and support the annular frame, a separator configured to separate the ring-shaped reinforcing portion by acting on a periphery of the ring-shaped reinforcing portion, and a discarding portion onto which the separated ring-shaped reinforcing portion is discarded, and the first raising and lowering table temporarily places the frame unit in which the cutting groove is formed on the temporary placement table, the temporary placement table is positioned at the separating portion by a temporary placement table transporting unit, and the second raising and lowering table supports the frame unit temporarily placed on the temporary placement table.

8. The processing apparatus according to claim 7, wherein the temporary placement table includes a heater, and the first raising and lowering table holds, from the temporary placement table, the frame unit in which the tape is heated by the heater and the tape closely adheres to the base of the ring-shaped reinforcing portion.

9. The processing apparatus according to claim 8, wherein the temporary placement table includes an annular supporting portion configured to support the peripheral surplus region of the wafer and leave a part on an inside of the peripheral surplus region in a noncontact state and a frame supporting portion disposed on a periphery of the annular supporting portion and configured to support the annular frame, and the frame supporting portion includes a strong permanent magnet having a stronger magnetic force than the permanent magnet of the first raising and lowering table and a detaching portion configured to detach the annular frame magnetically held by the strong permanent magnet.

10. The processing apparatus according to claim 7, wherein the no-ring unit unloading unit includes an inverting mechanism having a frame holding portion configured to face the no-ring unit supported by the second raising and lowering table and hold the annular frame, the inverting mechanism being configured to move toward the frame cassette table and invert the frame holding portion, a no-ring unit supporting portion configured to support the no-ring unit inverted by the inverting mechanism such that a top surface of the wafer is oriented upward, and a push-in portion configured to advance and house the no-ring unit supported by the no-ring unit supporting unit into the frame cassette mounted on the frame cassette table.

* * * * *